(12) United States Patent
Hwang et al.

(10) Patent No.: US 12,119,397 B2
(45) Date of Patent: Oct. 15, 2024

(54) SEMICONDUCTOR IC DEVICE INCLUDING PASSIVATION LAYER FOR INACTIVATING A DOPANT IN A P-TYPE SEMICONDUCTOR LAYER AND METHOD OF MANUFACTURING THE SAME

(71) Applicant: Samsung Electronics Co., Ltd., Suwon-si (KR)

(72) Inventors: Sunkyu Hwang, Seoul (KR); Jongseob Kim, Seoul (KR); Joonyong Kim, Seoul (KR); Younghwan Park, Seongnam-si (KR); Junhyuk Park, Pohang-si (KR); Jaejoon Oh, Seongnam-si (KR); Injun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 430 days.

(21) Appl. No.: 17/465,212

(22) Filed: Sep. 2, 2021

(65) Prior Publication Data
US 2022/0367698 A1   Nov. 17, 2022

(30) Foreign Application Priority Data
May 12, 2021 (KR) .................. 10-2021-0061645

(51) Int. Cl.
| | |
|---|---|
| *H01L 29/00* | (2006.01) |
| *H01L 29/20* | (2006.01) |
| *H01L 29/66* | (2006.01) |
| *H01L 29/778* | (2006.01) |

(52) U.S. Cl.
CPC ...... *H01L 29/7786* (2013.01); *H01L 29/2003* (2013.01); *H01L 29/66431* (2013.01)

(58) Field of Classification Search
CPC ............ H01L 29/2003; H01L 29/7786; H01L 29/66462; H01L 29/66431
See application file for complete search history.

(56) References Cited

U.S. PATENT DOCUMENTS

| | | |
|---|---|---|
| 10,439,059 B2 | 10/2019 | Palacios et al. |
| 10,651,303 B2 | 5/2020 | Shibib et al. |
| 2013/0062666 A1 | 3/2013 | Imada |
| (Continued) | | |

FOREIGN PATENT DOCUMENTS

CN    108565283 A    9/2018

OTHER PUBLICATIONS

Extended Search Report dated Feb. 15, 2022 issued in corresponding European patent application No. 21196944.9.
(Continued)

*Primary Examiner* — Reema Patel
(74) *Attorney, Agent, or Firm* — HARNESS, DICKEY & PIERCE, P.L.C.

(57) ABSTRACT

A semiconductor integrated circuit device includes: a channel layer, a barrier layer; a first p-type semiconductor layer and a second p-type semiconductor layer, spaced apart from each other on the barrier layer; and a passivation layer on the first p-type semiconductor layer and the second p-type semiconductor layer. The passivation layer may partially inactivate a dopant of at least one of the first p-type semiconductor layer and the second p-type semiconductor layer.

13 Claims, 18 Drawing Sheets

(56) References Cited

U.S. PATENT DOCUMENTS

| | | | |
|---|---|---|---|
| 2015/0263154 A1* | 9/2015 | Fujimoto | H01L 29/7786 |
| | | | 438/172 |
| 2015/0318387 A1 | 11/2015 | Chiu et al. | |
| 2018/0026106 A1 | 1/2018 | Yeh et al. | |
| 2020/0135722 A1 | 4/2020 | Chern | |
| 2020/0135910 A1 | 4/2020 | Chern | |
| 2020/0135911 A1 | 4/2020 | Chern | |

OTHER PUBLICATIONS

Xiangdong Li et al., "200 V Enhancement-Mode p-GaN HEMTs Fabricated on 200 mm GaN-on-SOI With Trench Isolation for Monolithic Integration" *IEEE Electron Device Letters*, vol. 38, No. 7, Jul. 2017, pp. 918-921.

Ronghui Hao et al., "Studies on Fabrication and Reliability of GaN High-Resistivity-Cap-Layer HEMT" *IEEE Transactions on Electron Devices*, vol. 65, No. 4, Apr. 2018, pp. 1314-1320.

Yaozong Zhong et al., "Normally-off HEMTs With Regrown p-GaN Gate and Low-Pressure Chemical Vapor Deposition $SiN_x$ Passivation by Using an AlN Pre-Layer" *IEEE Electron Device Letters*, vol. 40, No. 9, Sep. 2019, pp. 1495-1498.

E. V. Erofeev et al., 'Influence of Atomic Hydrogen Treatment on the Threshold Voltage of p-Gate High Voltage GaN Transistors' CS MANTECH Conference, May 19-22, 2014, Denver, Colorado, USA, pp. 145-148.

E. V. Erofeev et al., 'Increase the Threshold Voltage of High Voltage GaN Transistors by Low Temperature Atomic Hydrogen Treatment' *Semiconductors*, vol. 51, No. 2, 2017, pp. 245-248.

Yi-Cheng Chen et al., 'Silicon Nitride-induced Threshold Voltage Shift in p-GaN HEMTs with Au-free Gate-first Process' *2020 IEEE International Symposium on the Physical and Failure Analysis of Integrated Circuits (IPFA)*, 2020, pp. 1-5.

\* cited by examiner

SEMICONDUCTOR IC DEVICE INCLUDING PASSIVATION LAYER FOR INACTIVATING A DOPANT IN A P-TYPE SEMICONDUCTOR LAYER AND METHOD OF MANUFACTURING THE SAME

CROSS-REFERENCE TO RELATED APPLICATION

This application is based on and claims priority under 35 U.S.C. § 119 to Korean Patent Application No. 10-2021-0061645, filed on May 12, 2021, in the Korean Intellectual Property Office, the disclosure of which is incorporated by reference herein in its entirety.

BACKGROUND

1. Field

The present disclosure relates to semiconductor integrated circuit devices and/or methods of manufacturing the same.

2. Description of the Related Art

Various power converting systems may require a device for controlling the flow of current via ON/OFF switching, such as a switching device. In a power converting system, the efficiency of a switching device may decide the efficiency of the entire system.

It may be more and more difficult to increase the efficiency of a silicon (Si)-based power device due to the limitations of the properties of silicon and those of the manufacturing process. To overcome these limitations, research and development into increasing the conversion efficiency by applying a Group III-V compound semiconductor such as GaN to a power device are in progress. Recently, a high-electron-mobility transistor (HEMT) using a heterojunction structure of a compound semiconductor has been studied.

SUMMARY

Provided are semiconductor integrated circuit devices having a plurality of devices having two or more threshold voltages and/or methods of manufacturing the semiconductor integrated circuit devices.

Additional aspects will be set forth in part in the description which follows and, in part, will be apparent from the description, or may be learned by practice of the presented embodiments of the disclosure.

According to an embodiment, a semiconductor integrated circuit device includes a channel layer, a barrier layer on the channel layer and configured to induce a 2-dimensional electron gas (2DEG) in the channel layer, a first p-type semiconductor layer and a second p-type semiconductor layer spaced apart from each other on the barrier layer, and a passivation layer on the first p-type semiconductor layer and the second p-type semiconductor layer. The passivation layer partially inactivates at least one of a dopant of the first p-type semiconductor layer and a dopant of the second p-type semiconductor layer.

In some embodiments, the passivation layer may include a first portion on the first p-type semiconductor layer and a second portion on the second p-type semiconductor layer. A thickness or a material composition of the first portion may be different from a thickness or a material composition of the second portion. In some embodiments, both the thickness and the material composition of the first portion may be different from the thickness or the material composition of the second portion.

In some embodiments, the passivation layer may include a first passivation layer on the first p-type semiconductor layer and a second passivation layer on the second p-type semiconductor layer and the first passivation layer, and at least one of the first passivation layer and the second passivation layer may partially inactivate a dopant of at least one of the first p-type semiconductor layer and the second p-type semiconductor layer.

In some embodiments, the first passivation layer and the second passivation layer may partially inactivate the dopant of the first p-type semiconductor layer and the dopant of the second p-type semiconductor layer.

In some embodiments, the second passivation layer may partially inactivate the dopant of the second p-type semiconductor layer, and the first passivation layer may limit and/or prevent inactivation of the dopant of the first p-type semiconductor layer.

In some embodiments, a thickness of the first p-type semiconductor layer and a thickness of the second p-type semiconductor layer may be equal.

In some embodiments, the first p-type semiconductor layer and the second p-type semiconductor layer may have different thicknesses from each other.

In some embodiments, the semiconductor integrated circuit device may further include a first gate contacting the first p-type semiconductor layer, and a second gate contacting the second p-type semiconductor layer. The first gate may be partially inserted into the first p-type semiconductor layer or the second gate may be partially inserted into the second p-type semiconductor layer. In some embodiments, both the first gate may be partially inserted into the first p-type semiconductor layer and the second gate may be partially inserted into the second p-type semiconductor layer.

According to another embodiment, a semiconductor integrated circuit device includes a channel layer, a barrier layer on the channel layer and configured to induce a 2DEG in the channel layer, and a first p-type semiconductor layer and a second p-type semiconductor layer spaced apart from each other on the barrier layer. The first p-type semiconductor layer and the second p-type semiconductor layer may have different active dopant concentrations from each other.

In some embodiments, a thickness of the first p-type semiconductor layer and a thickness of the second p-type semiconductor layer may be equal.

In some embodiments, the first p-type semiconductor layer and the second p-type semiconductor layer may have different thicknesses from each other.

In some embodiments, the semiconductor integrated circuit device may further include a passivation layer on the first p-type semiconductor layer and the second p-type semiconductor layer. The passivation layer may partially inactivate at least one of a dopant of the first p-type semiconductor layer and a dopant of the second p-type semiconductor layer.

In some embodiments, the semiconductor integrated circuit device may further include a first gate contacting the first p-type semiconductor layer, and a second gate contacting the second p-type semiconductor layer. The first gate may be partially inserted into the first p-type semiconductor layer or the second gate may be partially inserted into the second p-type semiconductor layer. In some embodiments, both the first gate may be partially inserted into the first p-type semiconductor layer and the second gate may be partially inserted into the second p-type semiconductor layer.

According to an embodiment, a method of manufacturing a semiconductor integrated circuit device may include sequentially forming a channel layer, a barrier layer configured to induce a 2DEG in the channel layer, and a p-type semiconductor layer, and partially inactivating a dopant of a partial region of the p-type semiconductor layer.

In some embodiments, the partially inactivating may include partitioning the p-type semiconductor layer into a first p-type semiconductor layer and a second p-type semiconductor layer that are apart from each other, forming a first passivation layer on the first p-type semiconductor layer and the second p-type semiconductor layer, exposing the second p-type semiconductor layer by etching the first passivation layer, and forming a second passivation layer on the first passivation layer and the second p-type semiconductor layer. In a forming process, the first passivation layer may provide inactivation ions that inactivate a dopant of the first p-type semiconductor layer or the second passivation layer may provide inactivation ions that inactive a dopant of the second p-type semiconductor layer. In some embodiments, in the forming process, both the first passivation layer may provide the inactivation ions that inactivate the dopant of a first p-type semiconductor layer and the second passivation layer may provide the inactivation ions that inactivate a dopant of the second p-type semiconductor layer.

In some embodiments, in the forming process, the first passivation layer may partially inactivate the dopant of the first p-type semiconductor layers and the second passivation layer may partially inactivate the dopant of the second p-type semiconductor layer.

In some embodiments, the method may further include partially inactivating the dopant of the second p-type semiconductor layer before forming the second passivation layer.

In some embodiments, the method may further include forming a first gate and a second gate in contact with the first p-type semiconductor layer and the second p-type semiconductor layer. The first gate may be partially inserted into the first p-type semiconductor layer or the second gate may be partially inserted into the second p-type semiconductor layer. In some embodiments, both the first gate may be partially inserted into the first p-type semiconductor layer and the second gate may be partially inserted into the second p-type semiconductor layer.

In some embodiments, the inactivating may include forming a first protective layer on the p-type semiconductor layer, partitioning the p-type semiconductor layer into a first region covered by the first protective layer and a second region not covered by the first protective layer, by etching the first protective layer; and partially inactivating a dopant of the second region of the p-type semiconductor layer by forming an inactivation layer including a nitride, on the first protective layer and in the second region.

In some embodiments, the inactivating may include forming a first protective layer on the p-type semiconductor layer, partitioning the p-type semiconductor layer into a first region covered by the first protective layer and a second region not covered by the first protective layer, by etching the first protective layer, and supplying hydrogen ions to the p-type semiconductor layer in the second region.

According to an embodiment, a semiconductor integrated circuit device may include a channel layer; a barrier layer on the channel layer and configured to induce a 2-dimensional electron gas (2DEG) in the channel layer; a first p-type semiconductor layer and a second p-type semiconductor layer, spaced apart from each other on the barrier layer; a first passivation layer on the first p-type semiconductor layer and not the second p-type semiconductor layer; and a second passivation layer on the first p-type semiconductor layer and the second p-type semiconductor layer. The second passivation layer partially inactivates a dopant of the second p-type semiconductor layer.

In some embodiments, the first passivation layer may be configured to prevent the second passivation layer from inactivating a dopant of the first p-type semiconductor layer.

In some embodiments, a thickness of the first p-type semiconductor layer may differ from a thickness of the second p-type semiconductor layer.

In some embodiments, a thickness of the first p-type semiconductor layer may equal a thickness of the second p-type semiconductor layer.

In some embodiments, the semiconductor integrated circuit device may further include a first gate contacting the first p-type semiconductor layer; and a second gate contacting the second p-type semiconductor layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
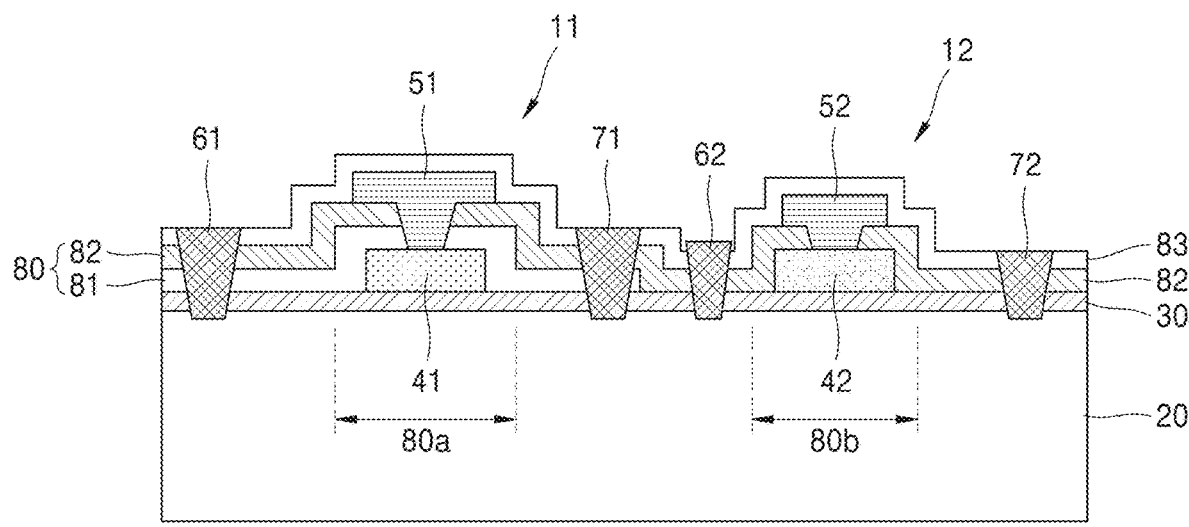
FIG. 1 is a schematic cross-sectional view of a semiconductor integrated circuit device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the attached drawings. In the drawings, like reference numerals denote like elements, and the sizes of the elements may be exaggerated for clarity and convenience. The embodiments described below are merely examples, and various modifications may be made from the embodiments.

Herein, a component referred to as being "above" or "on" another component can be directly on or below or on the left or right of other components, or intervening components may be present so the component may be on the intervening components and on the other components in a non-contacting manner. An expression used in the singular form encompasses the expression in the plural form, unless it has a clearly different meaning in the context. When a part "includes" a component, it means that the part may include the mentioned component alone or may include other components provided that there is no special indication to the contrary.

The use of the terms "the" and similar referents in are to be construed to cover both the singular and the plural. The steps of all methods described herein can be performed in any suitable order unless otherwise indicated herein or otherwise clearly contradicted by context.

In addition, terms such as " . . . unit", " . . . module", or the like refer to units that perform at least one function or operation, and the units may be implemented as hardware or software or as a combination of hardware and software.

Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device.

The use of any and all examples, or example language provided herein, is intended merely to better illuminate inventive concepts and does not pose a limitation on the scope of the present disclosure unless otherwise claimed.

FIG. 1 is a schematic cross-sectional view of a semiconductor integrated circuit device according to an embodiment. The semiconductor integrated circuit device includes two or more devices. In the present embodiment, the semiconductor integrated circuit device including two or more high-electron mobility transistors (HEMT) will be described as an example, but the present disclosure is not limited thereto. An HEMT may include semiconductor layers having different electrical polarization characteristics. In an HEMT, a semiconductor layer having a relatively high polarizability may induce 2-dimensional electron gas (2DEG) to another semiconductor layer bonded thereto, and the 2DEG may have a very high electron mobility. When a normally-on state is reached in an HEMT, in which a current flows due to a relatively low resistance between a drain electrode and a source electrode at a gate voltage of 0 V, current and power may be consumed, and in order to turn a current between the drain electrode and the source electrode into an off state, a negative voltage is to be applied to a gate electrode. To address these problems, a depletion forming layer may be included to implement the normally-off characteristics in which a current between a drain electrode and a source electrode is in an off state when a gate voltage is 0 V.

Referring to FIG. 1, the semiconductor integrated circuit device may include a channel layer 20, a barrier layer 30 that is provided on the channel layer 20 and induces 2DEG in the channel layer 20, and a first p-type semiconductor layer 41 and a second p-type semiconductor layer 42 spaced apart from each other on the barrier layer 30. The first p-type semiconductor layer 41 and the second p-type semiconductor layer 42 may have different active dopant concentrations from each other. In FIG. 1, the above-described material layers may be formed on a substrate (not shown), and FIG. 1 illustrates a state where the substrate is removed after the semiconductor integrated circuit device including two or more HEMTs is removed.

The channel layer 20 may include a material in which a 2DEG 21 may be formed thereinside. The barrier layer 30 may include a material having a greater energy band gap than the channel layer 20. The first p-type semiconductor layer 41 and the second p-type semiconductor layer 42 are formed on the barrier layer 30. The first p-type semiconductor layer 41 and the second p-type semiconductor layer 42 may have a different energy band gap from the barrier layer 30. The channel layer 20, the barrier layer 30, and the first and second p-type semiconductor layers 41 and 42 may include a same material, and may be distinguished from one another by relative positions and/or different material compositions thereof. For example, the channel layer 20, the barrier layer 30, and the first and second p-type semiconductor layers 41 and 42 may have a single or multi-layer structure including at least one material selected from nitrides including Group III-V materials, for example, at least one of Al, Ga, and In. For example, the channel layer 20, the barrier layer 30, and the first and second p-type semiconductor layers 41 and 42 may include $Al_xIn_yGa_{1-x-y}N$ ($0 \leq x \leq 1$, $0 \leq y \leq 1$, $x+y \leq 1$). For example, the channel layer 20, the barrier layer 30, and the first and second p-type semiconductor layers 41 and 42 may include at least one of AlN, GaN, InN, and InGaN or AlGaN, AlInN, and AlInGaN.

For example, the channel layer 20 may include GaN, and may be an undoped layer, or a layer doped with an impurity. The channel layer 20 may have a thickness of about several hundreds of nm or less. For example, the barrier layer 30 may include AlGaN. For example, the first p-type semiconductor layer 41 and the second p-type semiconductor layer 42 may include GaN. The first p-type semiconductor layer 41 and the second p-type semiconductor layer 42 may be p-type semiconductor layers doped with a p-type impurity such as magnesium (Mg).

First and second gates 51 and 52 respectively contact the first and second p-type semiconductor layers 41 and 42. A first source 61 and a first drain 71 are respectively at both sides of the first p-type semiconductor layer 41 and electrically contact the channel layer 20. A second source 62 and a second drain 72 are respectively at both sides of the second p-type semiconductor layer 42 and electrically contact the channel layer 20. The first and second gates 51 and 52, the first and second sources 61 and 71, and the first and second drains 62 and 72 may include an electrically conductive material.

A first HEMT 11 may be implemented by the channel layer 20, the barrier layer 30, the first p-type semiconductor layer 41, the first gate 51, the first source 61, and the first drain 71. Also, a second HEMT 12 may be implemented by the channel layer 20, the barrier layer 30, the second p-type semiconductor layer 42, the second gate 52, the second source 62, and the second drain 72. While a semiconductor integrated circuit device including two HEMTs is illustrated as an example in FIG. 1, a semiconductor integrated circuit device may also include three or more HEMTs.

The first p-type semiconductor layer 41 and the second p-type semiconductor layer 42 function as a depletion forming layer. As the first p-type semiconductor layer 41 and the second p-type semiconductor layer 42 may increase an energy band gap of portions of the barrier layer 30, the portions corresponding to the first p-type semiconductor layer 41 and the second p-type semiconductor layer 42, a depletion region of 2DEG may be formed in portions of the channel layer 20, the portions corresponding to the first p-type semiconductor layer 41 and the second p-type semiconductor layer 42. Accordingly, portions of the 2DEG, the portions corresponding to the first p-type semiconductor layer 41 and the second p-type semiconductor layer 42, may be cut or have different characteristics from other portions thereof (e.g., a different electron concentration). A region in which 2DEG is cut may be referred to as 'disconnected region,' and due to the disconnected region, the first and second HEMTs 11 and 12 may have normally-off characteristics that no current flows between a drain and a source at a gate voltage of 0 V.

In a semiconductor integrated circuit device including a plurality of HEMTs, at least one of the plurality of HEMTs may have a different threshold voltage from the others. A threshold voltage of an HEMT may be adjusted by adjusting a thickness, composition, or the like of semiconductor layers, for example, the barrier layer 30. However, a method of adjusting a threshold voltage of each HEMT by varying a thickness or composition of a semiconductor layer of each HEMT in a semiconductor integrated circuit device may not be practical in terms of the process complexity or performance stability. As another method, a threshold voltage of the first HEMT 11 and a threshold voltage of the second HEMT 12 may be made to be different from each other by adjusting dopant concentrations of the first and second p-type semiconductor layers 41 and 42. In this case, as the first and second p-type semiconductor layers 41 and 42 are to be grown under varying process conditions, the manufacturing process of a semiconductor integrated circuit device may be complicated. As another method, a method of adjusting a threshold voltage of an HEMT by implanting the barrier layer 30 with negatively charged ions such as F-ions may be considered. However, it may be difficult to vary the amount of ions to be implanted, differently according to locations in the barrier layer 30, and it may be difficult to adjust a projection range Rp when implanting negative ions into the barrier layer 30 that is relatively thin.

The semiconductor integrated circuit device according to the present embodiment may have a structure in which dopants of the first p-type semiconductor layer 41 and the second p-type semiconductor layer 42 which are relatively thick are selectively and partially inactivated. Accordingly, the first p-type semiconductor layer 41 and the second p-type semiconductor layer 42 have different active dopant concentrations from each other, and the first HEMT 11 and the second HEMT 12 have different threshold voltages from each other. An active dopant concentration refers to a concentration of dopants which are not inactivated.

Referring to FIG. 1, the semiconductor integrated circuit device may include a passivation layer 80 formed on the first p-type semiconductor layer 41 and the second p-type semiconductor layer 42. The passivation layer 80 may partially inactivate a dopant of at least one of the first p-type semiconductor layer 41 and the second p-type semiconductor layer 42 in a forming process of the passivation layer 80. The passivation layer 80 may provide inactivation ions to at least one of the first p-type semiconductor layer 41 and the second p-type semiconductor layer 42 in the forming process thereof. The inactivation ions combine with a portion of a dopant of at least one of the first p-type semiconductor layer 41 and the second p-type semiconductor layer 42 to inactivate the portion of the dopant thereof to thereby vary an active dopant concentration of at least one of the first p-type semiconductor layer 41 and the second p-type semiconductor layer 42. The inactivation ions may be, for example, hydrogen ions.

The passivation layer 80 may include a first portion 80a on the first p-type semiconductor layer 41 and a second portion 80b on the semiconductor layer 42, and at least one of a thickness and a material composition of the first portion 80a may be different from that of the second portion 80b. For example, the passivation layer 80 may include a first passivation layer 81 on the first p-type semiconductor layer 41 and a second passivation layer 82 on the first passivation layer 81 and the second p-type semiconductor layer 42. In this case, the first portion 80a includes the first and second passivation layers 81 and 82 that are sequentially stacked, and the second portion 80b includes the second passivation layer 82. Accordingly, the passivation layer 80 having the first portion 80a and the second portion 80a that have different thicknesses may be implemented. The first and second passivation layers 81 and 82 may include different materials from each other. For example, at least one of the first passivation layer 81 and the second passivation layer 82 may include a material via which a dopant of at least one of the first p-type semiconductor layer 41 and the second p-type semiconductor layer 42 may be partially inactivated. At least one of the first passivation layer 81 and the second passivation layer 82 may provide a hydrogen ion as an inactivation ion to at least one of the first p-type semiconductor layer 41 and the second p-type semiconductor layer 42.

For example, the first passivation layer 81 may partially inactivate the first p-type semiconductor layer 41, and the second passivation layer 82 may partially inactivate the second p-type semiconductor layer 42. The first passivation layer 81 is formed on the entire barrier layer 30 including the first p-type semiconductor layer 41 and the second p-type semiconductor layer 42, and then the first passivation layer 81 on the second p-type semiconductor layer 42 is removed through an etching process to expose the second p-type semiconductor layer 42. In this case, the first passivation layer 81 may partially inactivate the first p-type semiconductor layer 41 and the second p-type semiconductor layer 42. For example, the first and second passivation layers 81 and 82 may provide inactivation ions to the first and second p-type semiconductor layers 41 and 42 in a forming process of the first and second passivation layers 81 and 82. The inactivation ions may include, for example, hydrogen ions. The first and second passivation layers 81 and 82 may include a material that may provide hydrogen ions. For example, the first and second passivation layers 81 and 82 may include a nitride. The nitride may include, for example SiN or $SiO_xN_y$.

The SiN-first passivation layer 81 and the SiN-second passivation layer 82 may be formed by providing a process gas, for example, $NH_3$ and $SiH_4$, and hydrogen ions are generated in this process. First, in a process in which the SiN-first passivation layer 81 is formed, hydrogen ions are implanted into the first and second p-type semiconductor layers 41 and 42, upper surfaces of which are exposed. The hydrogen ions react with a dopant in the first and second p-type semiconductor layers 41 and 42, for example, with Mg, to form $MgH_2$, and inactivate Mg, and accordingly, active dopant concentrations of the first and second p-type semiconductor layers 41 and 42 are reduced. Next, in a process in which the SiN-second passivation layer 82 is formed, hydrogen ions are implanted into the second p-type semiconductor layer 42, the upper surface of which is exposed. The hydrogen ions react with a dopant in the second p-type semiconductor layer 42, for example, with Mg, to form $MgH_2$, and inactivate Mg, and accordingly, an active dopant concentration in the second p-type semiconductor layer 42 is further reduced. According to this configuration, as the active dopant concentrations of the first p-type semiconductor layer 41 and the second p-type semiconductor layer 42 are made to be different from each other, a semiconductor integrated circuit device including the first HEMT 11 and the second HEMT 12 having different threshold voltages from each other may be implemented.

For example, the first passivation layer 81 may be formed on the first p-type semiconductor layer 41 and function as a protective layer limiting and/or preventing inactivation of a dopant of the first p-type semiconductor layer 41, and the second passivation layer 82 may function in a forming process as an inactivation layer for partially inactivating a dopant of the second p-type semiconductor layer 42. For example, the second passivation layer 82 may provide hydrogen ions to the second p-type semiconductor layer 42 as inactivation ions in a forming process thereof, and the first passivation layer 81 may limit and/or prevent the hydrogen ions from penetrating into the first p-type semiconductor layer 41. The first passivation layer 81 may include, for example, an oxide. The oxide may include, for example, $SiO_2$, $HfO_x$, $Al_2O_3$, or the like. The second passivation layer 82 may include a material that may provide hydrogen ions. For example, the second passivation layer 82 may include a nitride. The nitride may include, for example, SiN or $SiO_xN_y$.

The SiN-second passivation layer 82 may be formed by providing a process gas, for example, $NH_3$ and $SiH_4$, and hydrogen ions are generated in this process. The hydrogen ions are implanted into the second p-type semiconductor layer 42, the upper surface of which is exposed. The hydrogen ions react with a dopant in the second p-type semiconductor layer 42, for example, with Mg, to form $MgH_2$, and inactivate Mg, and accordingly, active dopant concentrations of the second p-type semiconductor layer 42 are reduced. The first p-type semiconductor layer 41 is protected by the $SiO_2$-first passivation layer 81. As the hydrogen ions are blocked by the $SiO_2$-first passivation layer 81 and thus are not implanted into the first p-type semiconductor layer 41, an active dopant concentration of the first p-type semiconductor layer 41 is not varied. According to this configuration, as the active dopant concentrations of the first p-type semiconductor layer 41 and the second p-type semiconductor layer 42 are made to be different from each other, a semiconductor integrated circuit device including the first HEMT 11 and the second HEMT 12 having different threshold voltages from each other may be implemented.

When the first p-type semiconductor layer 41 and the second p-type semiconductor layer 42 have a same initial dopant concentration, the first p-type semiconductor layer 41 and the second p-type semiconductor layer 42 may be formed simultaneously under same process conditions. Also, by setting the first p-type semiconductor layer 41 and the second p-type semiconductor layer 42 to have a same thickness, the process of forming the first p-type semiconductor layer 41 and the second p-type semiconductor layer 42 may be simplified. After forming the first p-type semiconductor layer 41 and the second p-type semiconductor layer 42, by adjusting active dopant concentrations of the first p-type semiconductor layer 41 and the second p-type semiconductor layer 42 by appropriately selecting a material composition and thickness of a passivation layer on the first p-type semiconductor layer 41 and the second p-type semiconductor layer 42 in a process of forming the passivation layer 80 which is an interlayer dielectric layer, the first HEMT 11 and the second HEMT 12 having different threshold voltages from each other may be implemented. The active dopant concentration of the second p-type semiconductor layer 42 may be controlled by process conditions such as a thickness of an inactivation layer, for example, the second passivation layer 82, a flow rate of a precursor for forming the passivation layer, or the like. The thicker an inactivation layer, for example, the second passivation layer 82, the longer the process time for forming the second passivation layer 82 and the higher a flow rate of a precursor material, and accordingly, more hydrogen ions may penetrate into the second p-type semiconductor layer 42 to inactivate more dopants. Accordingly, the active dopant concentration of the second p-type semiconductor layer 42 may be further reduced.

A composition of a passivation layer on the first p-type semiconductor layer 41 may be different from that of a passivation layer on the second p-type semiconductor layer 42. In the embodiment illustrated in FIG. 1, the passivation layer on the first p-type semiconductor layer 41 may have a multi-layer structure including a nitride-first passivation layer 81 and a nitride-second passivation layer 82 or an oxide-first passivation layer 81 and a nitride-second passivation layer 82, and the passivation layer on the second p-type semiconductor layer 42 may have a single-layer structure including a nitride-second passivation layer 82. By varying the thickness and/or material composition of the passivation layers of the first and second HEMTs 11 and 12, a semiconductor integrated circuit device including the first and second HEMTs 11 and 12 having different threshold voltages from each other may be implemented through simple processes. Reference numeral 83 may denote an insulating layer.

Figure 2:
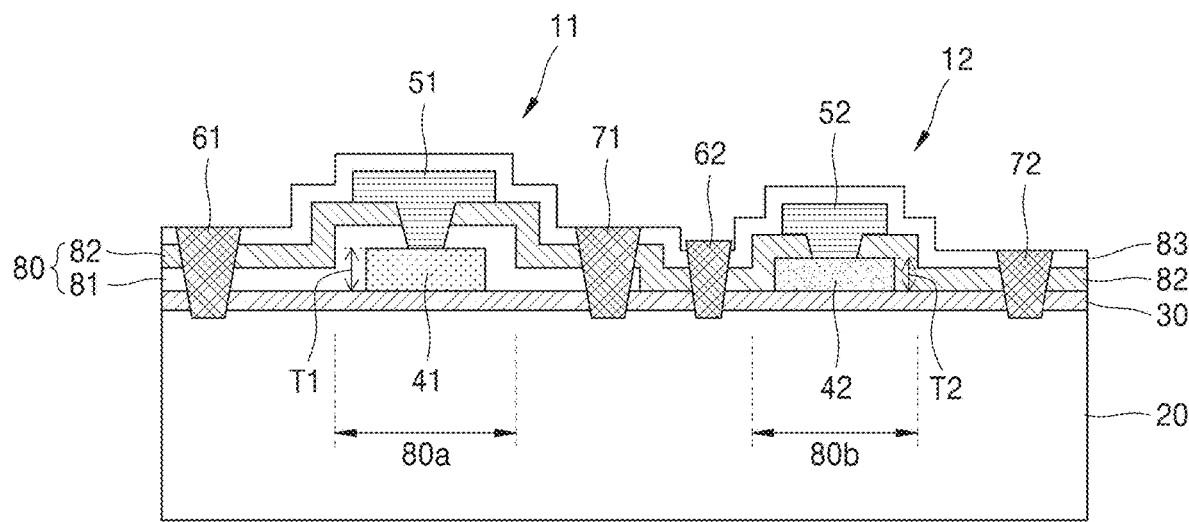
FIG. 2 is a schematic cross-sectional view of an embodiment of a semiconductor integrated circuit device.

A threshold voltage of an HEMT may be adjusted by a thickness of a p-type semiconductor layer. In an embodiment, the first p-type semiconductor layer 41 and the second p-type semiconductor layer 42 may have different thicknesses from each other. FIG. 2 is a schematic cross-sectional view of an embodiment of a semiconductor integrated circuit device. In the embodiment of the semiconductor integrated circuit device illustrated in FIG. 1, the first p-type semiconductor layer 41 and the second p-type semiconductor layer 42 have a same thickness as each other, and the first gate 51 and the second gate 52 are in contact with the upper surface of the first p-type semiconductor layer 41 and the upper surface of the second p-type semiconductor layer 42, respectively. Referring to FIG. 2, the semiconductor integrated circuit device according to the present embodiment is different from the embodiment of the semiconductor integrated circuit device illustrated in FIG. 1 in that thicknesses of the first p-type semiconductor layer 41 and the second p-type semiconductor layer 42 are different from each other. Hereinafter, description will focus on the differences. For example, a thickness T1 of the first p-type semiconductor layer 41 may be greater than a thickness T2 of the second p-type semiconductor layer 42. According to this configuration, a difference between active dopant concentrations of the first p-type semiconductor layer 41 and the second p-type semiconductor layer 42 is further increased, and a difference between threshold voltages of the first HEMT 11 and the second HEMT 12 may be further increased.

Figure 3:
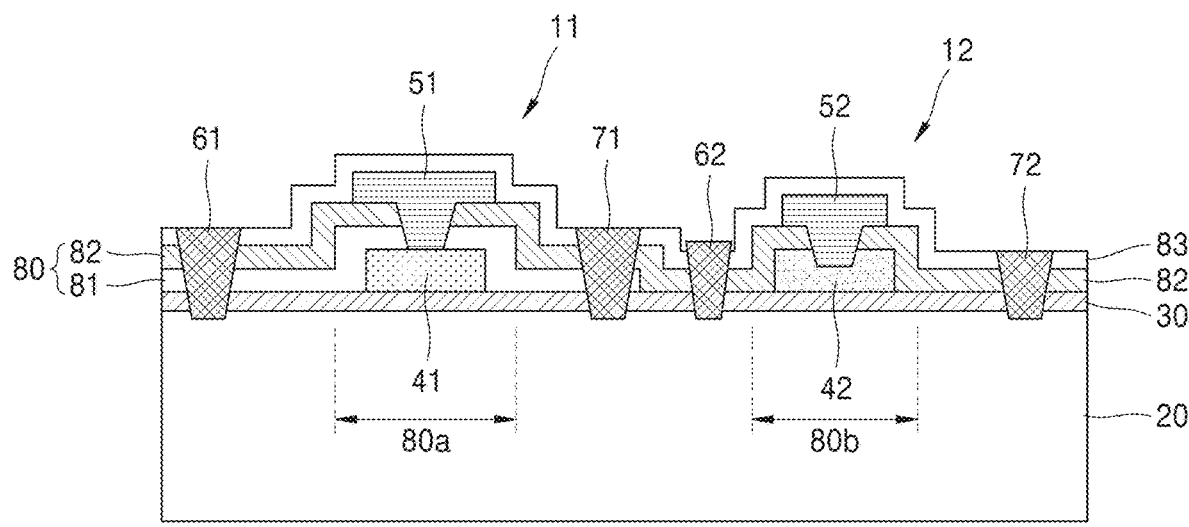
FIG. 3 is a schematic cross-sectional view of an embodiment of a semiconductor integrated circuit device.

An actual thickness of a p-type semiconductor layer may be controlled using a gate. FIG. 3 is a schematic cross-sectional view of an embodiment of a semiconductor integrated circuit device. In the embodiment of the semiconductor integrated circuit device illustrated in FIG. 1, the first gate 51 and the second gate 52 are in contact with the upper surface of the first p-type semiconductor layer 41 and the upper surface of the second p-type semiconductor layer 42, respectively. Referring to FIG. 3, the semiconductor integrated circuit device according to the present embodiment is different from the embodiment of the semiconductor integrated circuit device illustrated in FIG. 1 in that the second gate 52 is partially inserted into the second p-type semiconductor layer 42. Hereinafter, description will focus on the differences. The first p-type semiconductor layer 41 and the second p-type semiconductor layer 42 have a same thickness as each other. The first gate 51 is in contact with the upper surface of the first p-type semiconductor layer 41. The second gate 52 is inserted into the second p-type semiconductor layer 42 beyond the upper surface of the second p-type semiconductor layer 42. The second gate 52 may extend to a certain position between the upper surface and a lower surface of the second p-type semiconductor layer 42. The effect of reducing the thickness of the second p-type semiconductor layer 42 may be obtained by the second gate 52 inserted into the second p-type semiconductor layer 42. According to this configuration, active dopant concentrations of the first p-type semiconductor layer 41 and the second p-type semiconductor layer 42 may be made to be different from each other, and at the same time, thicknesses of the first p-type semiconductor layer 41 and the second p-type semiconductor layer 42 may also be made to be different from each other to thereby vary threshold voltages of the first and second HEMTs 11 and 12 from each other.

Figure 4:
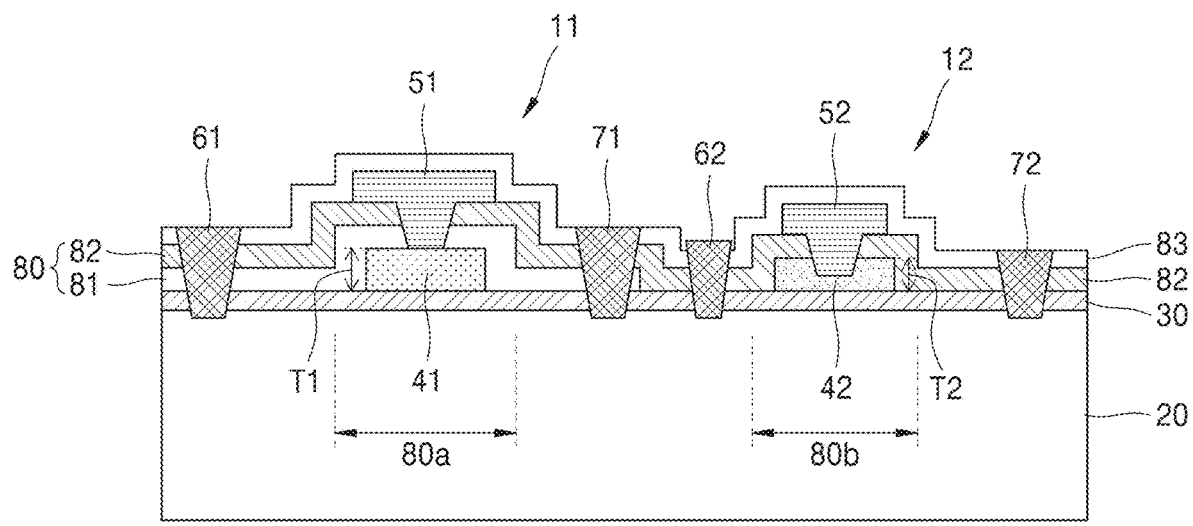
FIG. 4 is a schematic cross-sectional view of an embodiment of a semiconductor integrated circuit device.

A shape of the second gate 52 applied to the embodiment of the semiconductor integrated circuit device of FIG. 3 may also apply to the embodiment of the semiconductor integrated circuit device illustrated in FIG. 2. FIG. 4 is a schematic cross-sectional view of an embodiment of a semiconductor integrated circuit device. In the embodiment of the semiconductor integrated circuit device illustrated in FIG. 2, the first gate 51 and the second gate 52 are in contact with the upper surface of the first p-type semiconductor layer 41 and the upper surface of the second p-type semiconductor layer 42, respectively. Referring to FIG. 4, the semiconductor integrated circuit device according to the present embodiment is different from the embodiment of the semiconductor integrated circuit device illustrated in FIG. 2 in that the second gate 52 is partially inserted into the second p-type semiconductor layer 42. Hereinafter, description will focus on the differences. The thickness T1 of the first p-type semiconductor layer 41 is greater than the thickness T2 of the second p-type semiconductor layer 42. The first gate 51 is in contact with the upper surface of the first p-type semiconductor layer 41. The second gate 52 is inserted into the second p-type semiconductor layer 42 beyond the upper surface of the second p-type semiconductor layer 42. The second gate 52 may extend to a certain position between the upper and lower surfaces of the second p-type semiconductor layer 42. The effect of reducing the thickness of the second p-type semiconductor layer 42 may be obtained by the second gate 52 inserted into the second p-type semiconductor layer 42. According to this configuration, the active dopant concentrations of the first p-type semiconductor layer 41 and the second p-type semiconductor layer 42 may be made to be different from each other, and at the same time, thicknesses of the first p-type semiconductor layer 41 and the second p-type semiconductor layer 42 may also be made to be different from each other to thereby vary threshold voltages of the first and second HEMTs 11 and 12 from each other.

Figure 5:
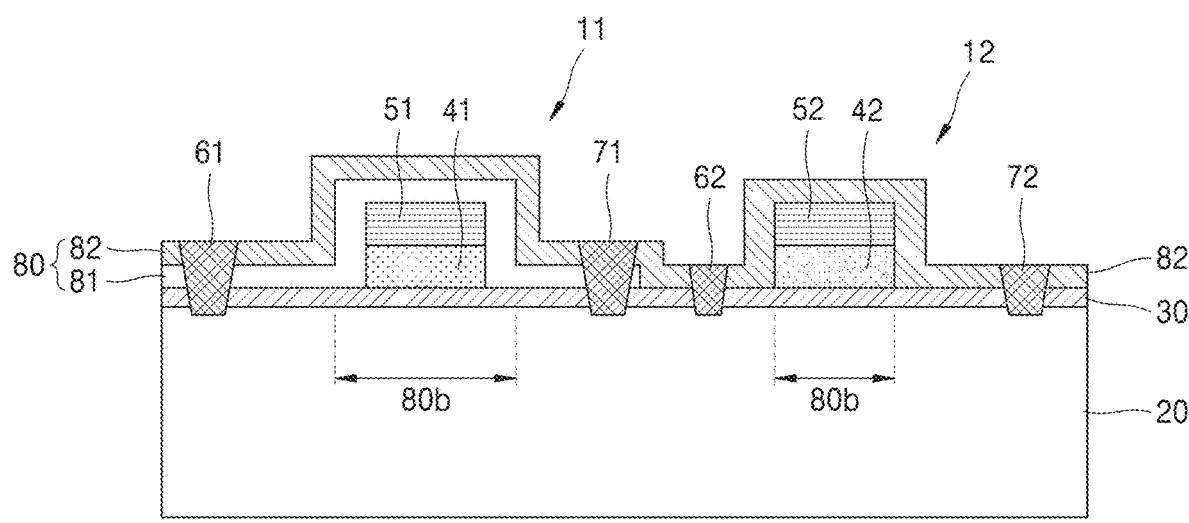
FIG. 5 is a schematic cross-sectional view of an embodiment of a semiconductor integrated circuit device.
Figure 6:
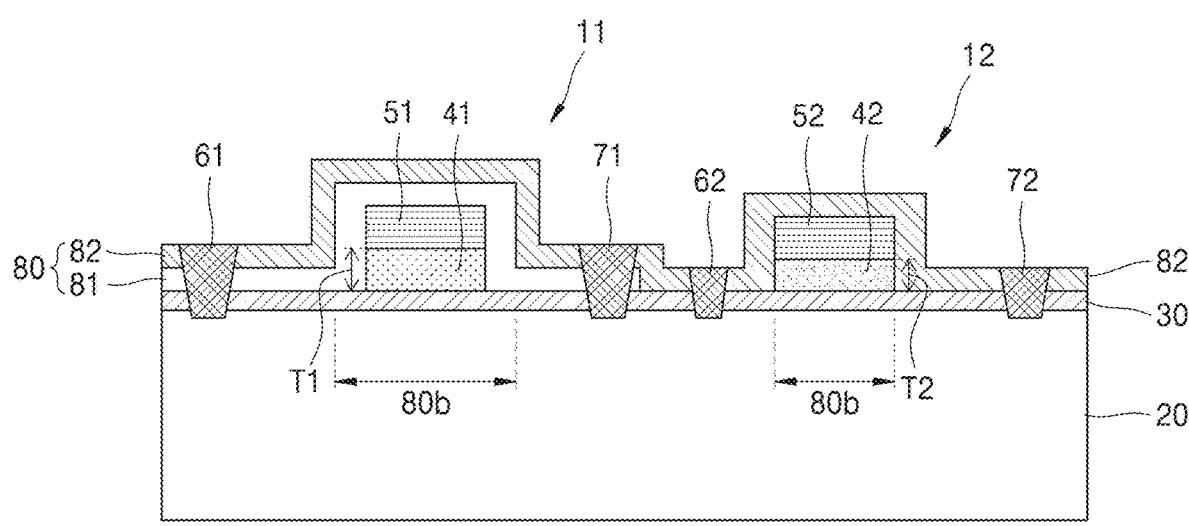
FIG. 6 is a schematic cross-sectional view of an embodiment of a semiconductor integrated circuit device.

FIGS. 5 and 6 are schematic cross-sectional view of an embodiment of a semiconductor integrated circuit device. First, referring to FIG. 5, the semiconductor integrated circuit device according to the present embodiment is different from the semiconductor integrated circuit device illustrated in FIG. 1 in that the first and second gates 51 and 52 are formed on the first and second p-type semiconductor layers 41 and 42, respectively, and the passivation layer 80 is formed on the first and second gates 51 and 52. In this case, also, in the process of forming the nitride-first passivation layer 81, a dopant of the first p-type semiconductor layer 41 or dopants of the first and second p-type semiconductor layers 41 and 42 may be partially inactivated, and the dopant of the second p-type semiconductor layer 42 may be partially inactivated by the nitride-second passivation layer 82. Next, referring to FIG. 6, the semiconductor integrated circuit device according to the present embodiment is different from the embodiment of the semiconductor integrated circuit device illustrated in FIG. 5 in that the thickness T1 of the first p-type semiconductor layer 41 is greater than the thickness T2 of the second p-type semiconductor layer 42.

Hereinafter, embodiments of a method of manufacturing a semiconductor integrated circuit device will be described. In the method of manufacturing a semiconductor integrated circuit device, a channel layer, a barrier layer inducing 2DEG in the channel layer, and a p-type semiconductor layer are sequentially formed, and a dopant of a partial region of the p-type semiconductor layer may be partially inactivated. Inactivation may be performed using various methods. For example, a p-type semiconductor layer may be partitioned into a region protected by a protective layer and a region not protected, and a dopant of the non-protected region may be partially inactivated.

An embodiment of the method of manufacturing a semiconductor integrated circuit device may include: sequentially forming a channel layer, a barrier layer inducing 2DEG in the channel layer, and a p-type semiconductor layer; partitioning the p-type semiconductor layer into a first p-type semiconductor layer and second p-type semiconductor layer that are apart from each other; forming a first passivation layer on the first p-type semiconductor layer and the second p-type semiconductor layer; exposing the second p-type semiconductor layer by etching the first passivation layer; forming a second passivation layer on the first passivation layer and the second p-type semiconductor layer, wherein at least one of the first and second passivation layers may provide inactivation ions for inactivating a dopant of a p-type semiconductor layer, to which the at least one of the first and second passivation layers corresponds, in a forming process of the at least one of the first and second passivation layers. The inactivation ions may include hydrogen ions.

The first and second passivation layers may partially inactivate dopants of the first and second p-type semiconductor layers in a forming process of the first and second passivation layers. The first and second passivation layers may include a nitride. The nitride may include at least one of SiN and $SiN_xO_y$.

The second passivation layer may partially inactivate a dopant of the second p-type semiconductor layer, and the first passivation layer may limit and/or prevent inactivation of the first p-type semiconductor layer. The first passivation layer may include an oxide, and the second passivation layer may include a nitride. The oxide may include at least one of $SiO_2$, $HfO_x$, and $Al_2O_3$, and the nitride may include at least one of SiN and $SiN_xO_y$.

The method may include partially inactivating a dopant of the second p-type semiconductor layer before forming the second passivation layer. The partial inactivating may include supplying hydrogen ions to the second p-type semiconductor layer.

The method includes forming a first gate and a second gate that are respectively in contact with the first p-type semiconductor layer and the second p-type semiconductor layer, wherein at least one of the first gate and the second gate may be partially inserted into a p-type semiconductor layer to which the at least one of the first gate and the second gate corresponds.

FIGS. 7A through 7F are diagrams illustrating an embodiment of a method of manufacturing a semiconductor integrated circuit device. The embodiment of the method of manufacturing a semiconductor integrated circuit device, illustrated in FIGS. 7A through 7F, relates to sequentially forming a channel layer, a barrier layer inducing 2DEG in the channel layer, and a p-type semiconductor layer, and partially inactivating a dopant of a partial region of the p-type semiconductor layer. A growth substrate is omitted in FIGS. 7A through 7F.

Figure 7A:
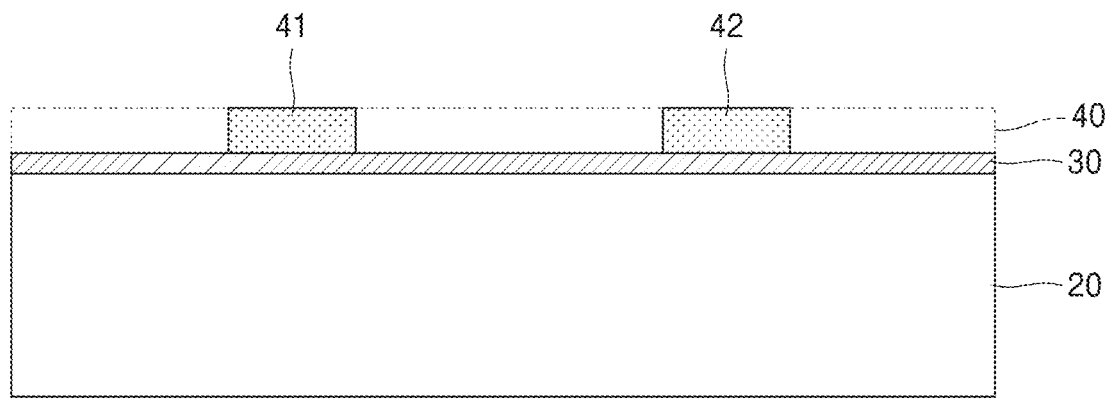
FIGS. 7A through 7F are diagrams illustrating an embodiment of a method of manufacturing a semiconductor integrated circuit device.

First, referring to FIG. 7A, a channel layer 20, a barrier layer 30 inducing 2DEG in the channel layer 20, and a p-type semiconductor layer 40 are sequentially formed on a substrate (not shown). The channel layer 20, the barrier layer 30, and the p-type semiconductor layer 40 may have a single-layer or multi-layer structure including at least one material selected from nitrides including Group III-V materials, for example, at least one of Al, Ga, and In. For example, the channel layer 20, the barrier layer 30, and the p-type semiconductor layer 40 may include $Al_xIn_yGa_{1-x-y}N$ ($0 \leq x \leq 1$, $0 \leq y \leq 1$, $x+y \leq 1$). For example, the channel layer 20, the barrier layer 30, and the p-type semiconductor layer 40 may include at least one of AlN, GaN, InN, and InGaN or AlGaN, AlInN, and AlInGaN. The channel layer 20, the barrier layer 30, and the p-type semiconductor layer 40 may include a same material as each other, and may be distinguished from one another by relative positions and/or different material compositions thereof. For example, the channel layer 20 may include GaN, and may be an undoped layer, or a layer doped with an impurity. The channel layer 20 may have a thickness of about several hundreds of nm or less. For example, the barrier layer 30 may include AlGaN. For example, the p-type semiconductor layer 40 include GaN. The p-type semiconductor layer 40 may be doped with a p-type impurity such as Mg. The p-type semiconductor layer 40 is formed with a uniform thickness on the barrier layer 30 as shown by a dashed line in FIG. 7A, and a dopant concentration thereof is also uniform.

The substrate may include, for example, sapphire, Si, SiC, or GaN, but is not limited thereto, and may include other various materials. For example, although not illustrated in the drawings, a seed layer and a buffer layer may be sequentially provided on the substrate, and the channel layer 20 may be formed on the buffer layer. The seed layer may be a base layer for growth of the buffer layer. The buffer layer mitigates a difference in lattice constants and coefficients of thermal expansion between the substrate and the channel layer 20 to thereby limit and/or prevent degradation in the crystallinity of the channel layer 20. The buffer layer may include at least one material selected from nitrides including Group III-V materials, for example, at least one of Al, Ga, and In.

Next, as illustrated by a solid line in FIG. 7A, the p-type semiconductor layer 40 is partitioned into a first p-type semiconductor layer 41 and a second p-type semiconductor layer 42 that are apart from each other. The partitioning operation may be performed by forming an etch mask on the p-type semiconductor layer 40 and partially etching the p-type semiconductor layer 40. Accordingly, the first p-type semiconductor layer 41 and the second p-type semiconductor layer 42 having a same dopant concentration and a same thickness are formed on the barrier layer 30.

Figure 7B:
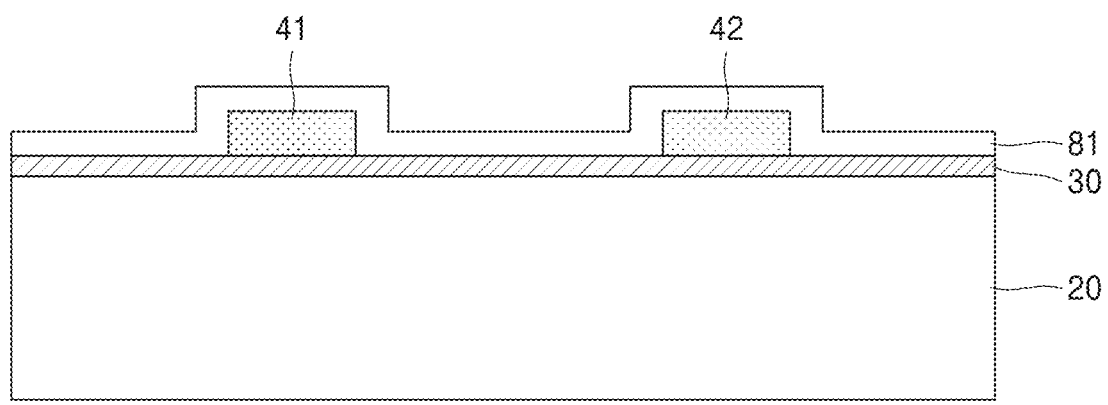
Figure 7C:
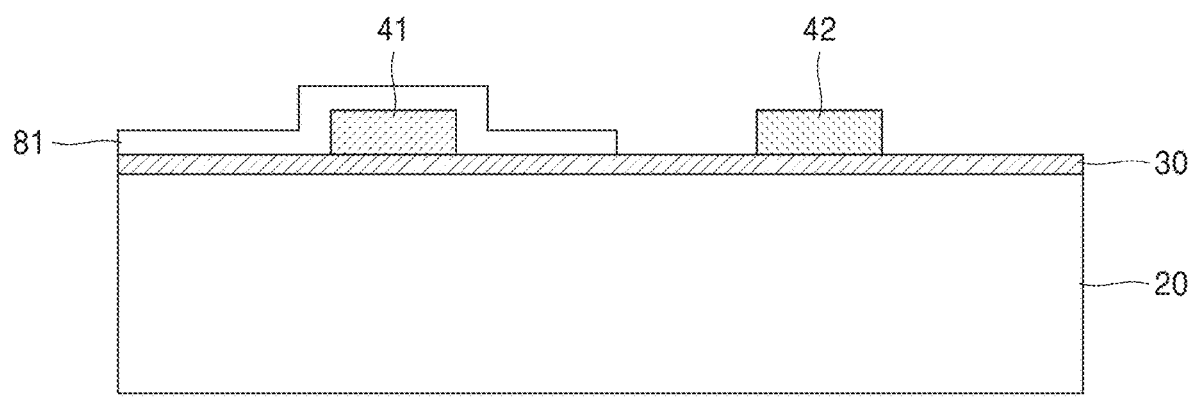
Figure 7D:
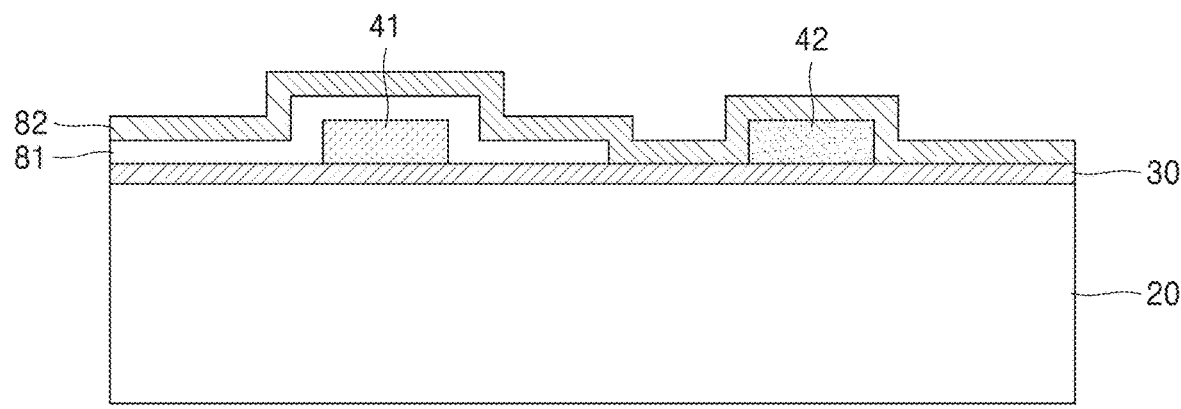

Next, referring to FIG. 7B, a first passivation layer 81 is formed on the first p-type semiconductor layer 41 and the second p-type semiconductor layer 42. Next, as illustrated in FIG. 7C, the first passivation layer 81 is partially etched to expose the second p-type semiconductor layer 42. Next, as illustrated in FIG. 7D, a second passivation layer 82 is formed on the second p-type semiconductor layer 42. The second passivation layer 82 may be formed also on the first passivation layer 81. Accordingly, the process of forming the second passivation layer 82 may be simplified. At least one of the first and second passivation layers 81 and 82 may provide inactivation ions for inactivating a dopant of the p-type semiconductor layer 40 during a formation process thereof. The inactivation ions may include, for example, hydrogen ions.

For example, the first and second passivation layers 81 and 82 may partially inactivate dopants of the first and second p-type semiconductor layers 41 and 42 in a forming process thereof. For example, the first passivation layer 81 may partially inactivate the first p-type semiconductor layer 41, and the second passivation layer 82 may partially inactivate the second p-type semiconductor layer 42. For example, the first and second passivation layers 81 and 82 may include a nitride. The nitride may include, at least one of, for example SiN and $SiO_xN_y$.

For example, the SiN-first passivation layer 81 and the SiN-second passivation layer 82 may be formed by providing a process gas, for example, $NH_3$ and $SiH_4$, and hydrogen ions are generated in this process. First, as illustrated in FIG. 7B, in a process in which the SiN-first passivation layer 81 is formed, hydrogen ions are implanted into the first and second p-type semiconductor layers 41 and 42, upper surfaces of which are exposed. The hydrogen ions react with a dopant in the first and second p-type semiconductor layers 41 and 42, for example, with Mg, to form $MgH_2$ and inactivate Mg, and accordingly, active dopant concentrations of the first and second p-type semiconductor layers 41 and 42 are reduced. Next, as illustrated in FIG. 7D, in a process in which the SiN-second passivation layer 82 is formed, hydrogen ions are implanted into the second p-type semiconductor layer 42, the upper surface of which is exposed. The hydrogen ions react with a dopant in the second p-type semiconductor layer 42, for example, with Mg, to form MgH$_2$, and inactivate Mg, and accordingly, the active dopant concentration of the second p-type semiconductor layer 42 is further reduced. According to this configuration, as the active dopant concentrations of the first p-type semiconductor layer 41 and the second p-type semiconductor layer 42 are different from each other, a semiconductor integrated circuit device including the first HEMT 11 and the second HEMT 12 having different threshold voltages from each other may be implemented.

For example, the second passivation layer 82 may be an inactivation layer that partially inactivates the dopant of the second p-type semiconductor layer 42, and the first passivation layer 81 may be a protective layer for limiting and/or preventing inactivation of the first p-type semiconductor layer 41. The first passivation layer 81 may include, for example, an oxide. The oxide may include, for example, SiO$_2$, HfO$_x$, Al$_2$O$_3$, or the like. The second passivation layer 82 may include a nitride that may provide hydrogen ions, for example, at least one of SiN and SiN$_x$O$_y$. For example, by providing, for example, NH$_3$ and SiH$_4$ as a process gas, the SiN-second passivation layer 82 may be formed as illustrated in FIG. 7D. Hydrogen ions are generated in this process, and the hydrogen ions are implanted into the second p-type semiconductor layer 42, the upper surface of which is exposed. The hydrogen ions react with a dopant in the second p-type semiconductor layer 42, for example, Mg, to form MgH$_2$, thereby inactivating Mg. Accordingly, the active dopant concentration in the second p-type semiconductor layer 42 is reduced. The first p-type semiconductor layer 41 is protected by, for example, the SiO$_2$-first passivation layer 81, and thus, hydrogen ions are not implanted into the first p-type semiconductor layer 41. Accordingly, the active dopant concentration in the first p-type semiconductor layer 41 is not varied. According to this configuration, the active dopant concentration of the first p-type semiconductor layer 41 and the active dopant concentration of the second p-type semiconductor layer 42 become different from each other.

Figure 7E:
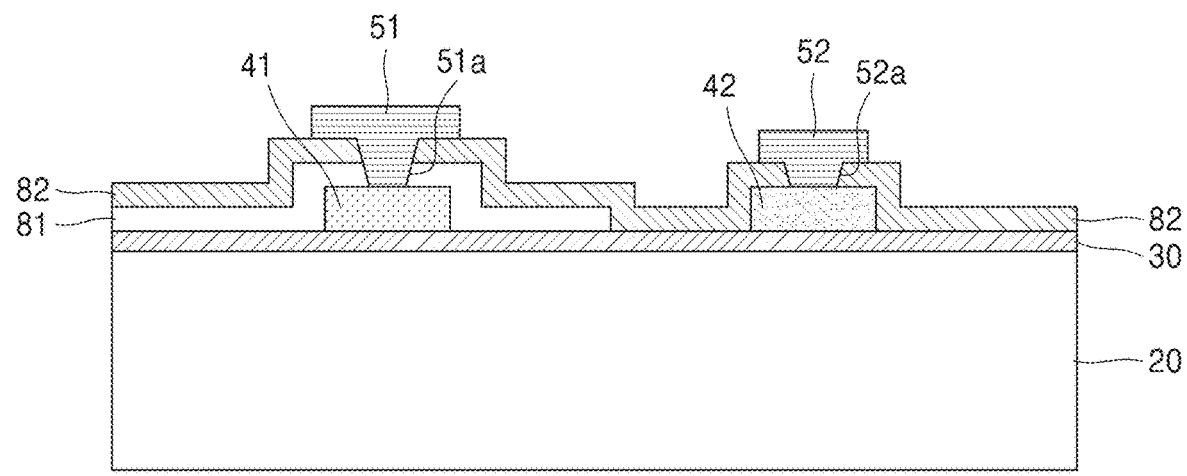

Next, as illustrated in FIG. 7E, a first gate 51 and a second gate 52 respectively contacting the first p-type semiconductor layer 41 and the second p-type semiconductor layer 42 are formed. For example, a via 51a passing through the second passivation layer 82 and the first passivation layer 81 is formed, and the first gate 51 that contacts the upper surface of the first p-type semiconductor layer 41 via the via 51a may be formed on the second passivation layer 82. Also, a via 52a passing through the second passivation layer 82 may be formed, and the second gate 52 that contacts the upper surface of the second p-type semiconductor layer 42 via the via 52a may be formed on the second passivation layer 82. The first gate 51 and the second gate 52 may include a conductive metal or metal compound or the like.

Figure 7F:
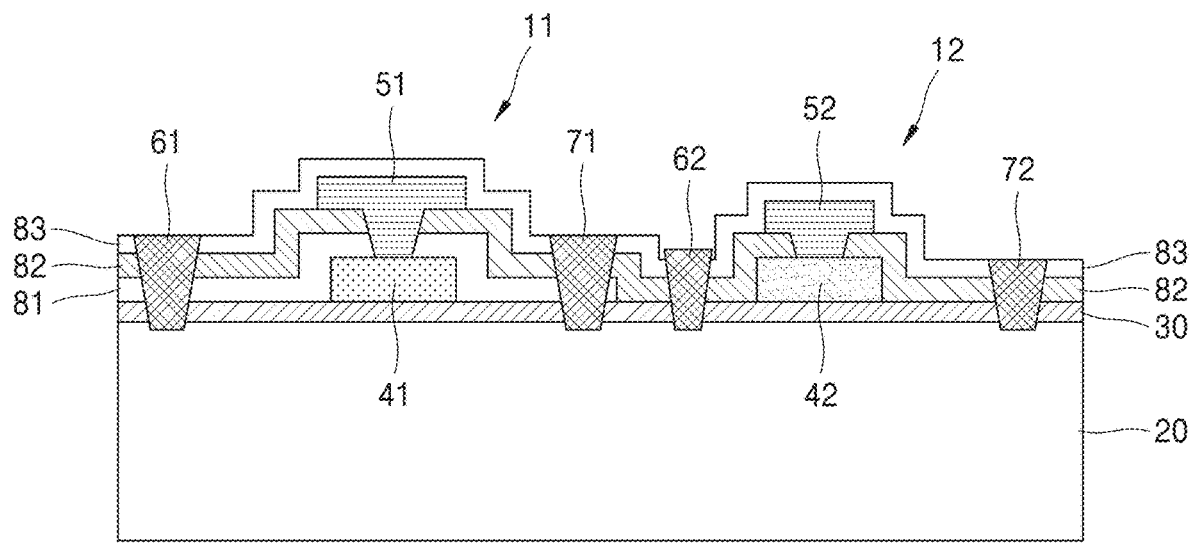

Next, as illustrated in FIG. 7F, an insulating layer 83 is formed on the first and second gates 51 and 52 and the second passivation layer 82. The insulating layer 83 may include, for example, an oxide. Next, first and second sources 61 and 62 and first and second drains 71 and 72 that contact the channel layer 20 are formed. The first source 61 and the first drain 71 are located at both sides of the first p-type semiconductor layer 41, and pass through the insulating layer 83, the second passivation layer 82, and the first passivation layer 81 to contact the channel layer 20. The first source 61 and the first drain 71 may pass beyond the channel layer 20 to be partially inserted into the channel layer 20. The second source 62 and the second drain 72 are located at both sides of the second p-type semiconductor layer 42, and pass through the insulating layer 83 and the second passivation layer 82 to contact the channel layer 20. The second source 62 and the second drain 72 may pass beyond the channel layer 20 to be partially inserted into the channel layer 20. The first and second sources 61 and 71 and the first and second drains 62 and 72 may include a conductive material. The conductive material may include, for example, a conductive metal or a conductive metal oxide.

According to this configuration, the first and second HEMTs 11 and 12 may have different threshold voltages from each other. According to the manufacturing method of the present embodiment, as initial dopant concentrations of the first p-type semiconductor layer 41 and the second p-type semiconductor layer 42 may be identical to each other, the first p-type semiconductor layer 41 and the second p-type semiconductor layer 42 may be formed simultaneously under the same process conditions. Also, by setting the first p-type semiconductor layer 41 and the second p-type semiconductor layer 42 to have the same thickness, the process of forming the first p-type semiconductor layer 41 and the second p-type semiconductor layer 42 may be simplified. After forming the first p-type semiconductor layer 41 and the second p-type semiconductor layer 42, by adjusting active dopant concentrations of the first p-type semiconductor layer 41 and the second p-type semiconductor layer 42 by appropriately selecting a type and thickness of the first and second passivation layers 81 and 82 on the first p-type semiconductor layer 41 and the second p-type semiconductor layer 42 in a process of forming a passivation layer which is an interlayer dielectric layer, the first HEMT 11 and the second HEMT 12 having different threshold voltages from each other may be implemented. The active dopant concentration of the second p-type semiconductor layer 42 may be controlled by process conditions such as a thickness of the second passivation layer 82, a flow rate of a precursor, a process temperature, or the like. The thicker the second passivation layer 82, the longer the process time for forming the second passivation layer 82, and the higher a flow rate of a precursor material, more hydrogen may penetrate into the second p-type semiconductor layer 42 to inactivate more dopants. Accordingly, the active dopant concentration of the second p-type semiconductor layer 42 may be further reduced.

Figure 8A:
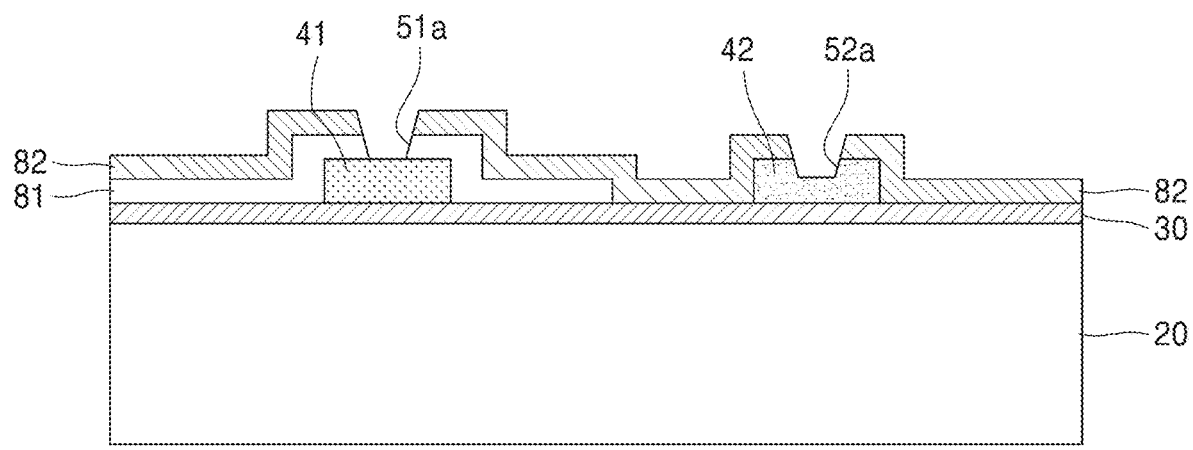
FIGS. 8A and 8B are diagrams illustrating an embodiment of a method of manufacturing a semiconductor integrated circuit device.
Figure 8B:
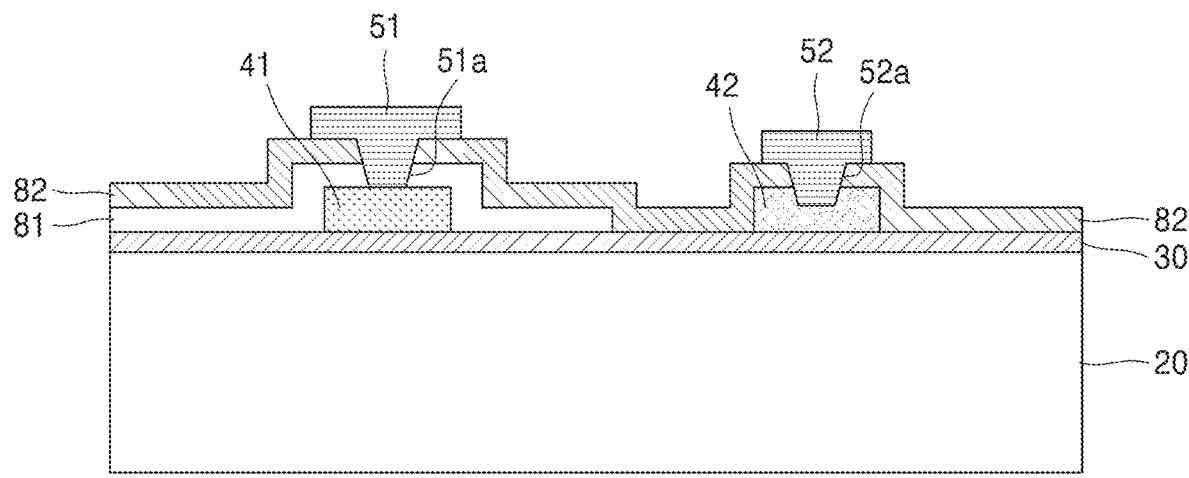

At least one of the first gate 51 and the second gate 52 may be partially inserted into a p-type semiconductor layer. The above-described structure may be provided by replacing the operation of FIG. 7E described above with operations of FIGS. 8A and 8B described below. FIGS. 8A and 8B are diagrams illustrating an embodiment of a method of manufacturing a semiconductor integrated circuit device. The operations of FIGS. 7A through 7D described above are performed. Next, as illustrated in FIG. 8A, a via 51a that passes through the second passivation layer 82 and the first passivation layer 81 to expose the upper surface of the first p-type semiconductor layer 41 is formed. Also, a via 52a that passes through the second passivation layer 82 to extend beyond the upper surface of the second p-type semiconductor layer 42 and partially into the second p-type semiconductor layer 42 is formed. Next, as illustrated in FIG. 8B, the first gate 51 contacting the upper surface of the first p-type semiconductor layer 41 via the via 51a and the second gate 52 that is partially inserted into the second p-type semiconductor layer 42 via the via 52a may be formed on the second passivation layer 82. According to this configuration, the semiconductor integrated circuit device illustrated in FIG. 3 may be implemented.

Figure 8C:
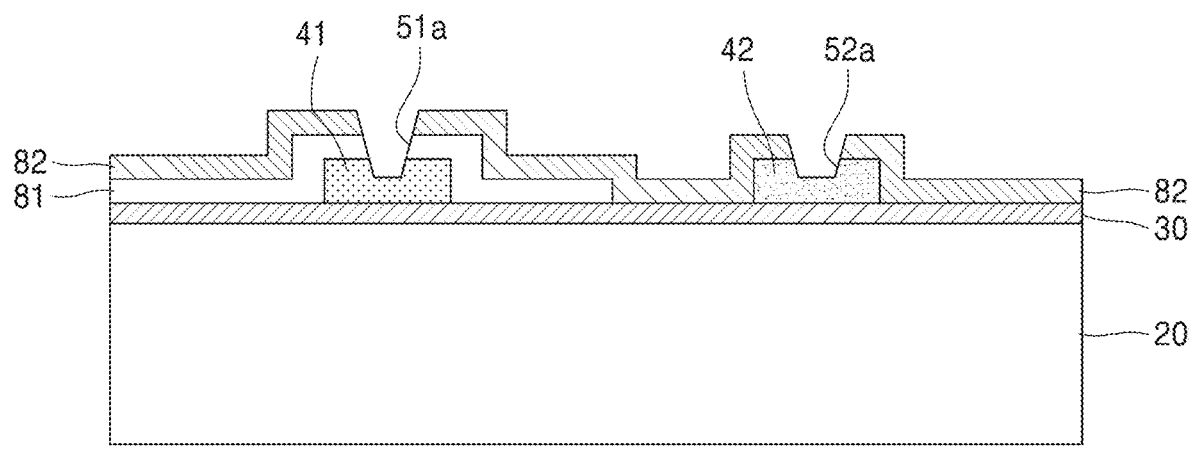
FIGS. 8C and 8D are diagrams illustrating an embodiment of a method of manufacturing a semiconductor integrated circuit device.
Figure 8D:
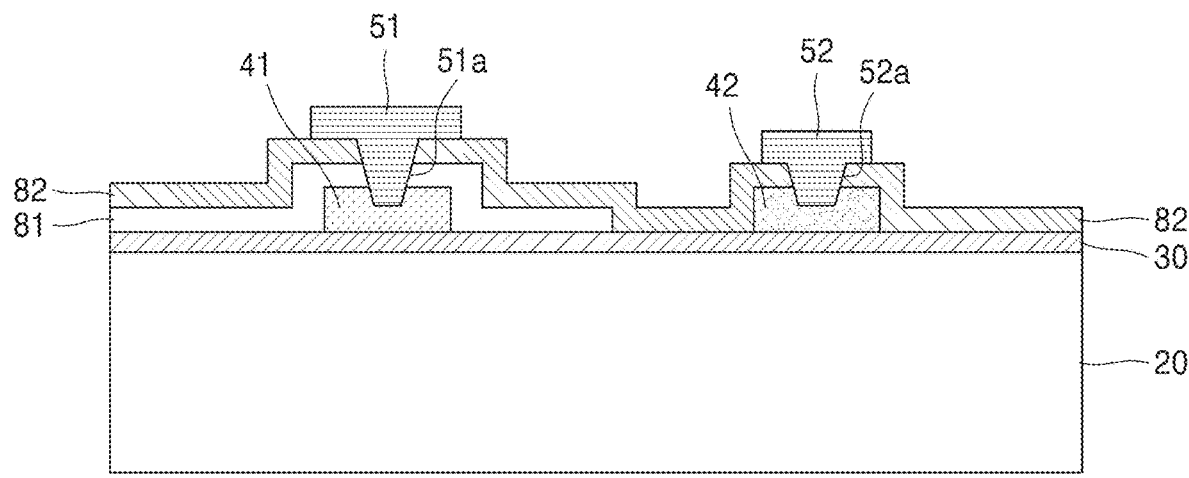

In an embodiment, as illustrated in FIGS. 8C and 8D, a semiconductor integrated circuit device may be formed where the first gate 51 is partially inserted into the first p-type semiconductor layer 41 via the via 51a and the second gate 52 may be partially inserted into the second p-type semiconductor layer 42 via the via 52a. The embodiment in FIGS. 8C and 8D differs from the embodiment in FIGS. 8A and 8B because the via 51a formed in FIG. 8C passes through the second passivation layer 82 and the first passivation layer 81 to penetrate partially into the first p-type semiconductor layer 41. Although not illustrated, an insulating layer 83 may be formed over the second passivation layer 82, first gate 51, and second gate 52 in FIG. 8D. Then, first and second sources 61 and 62 and first and second drains 71 and 72 that connect the channel layer 20 may be formed like those shown in FIG. 3.

Figure 8E:
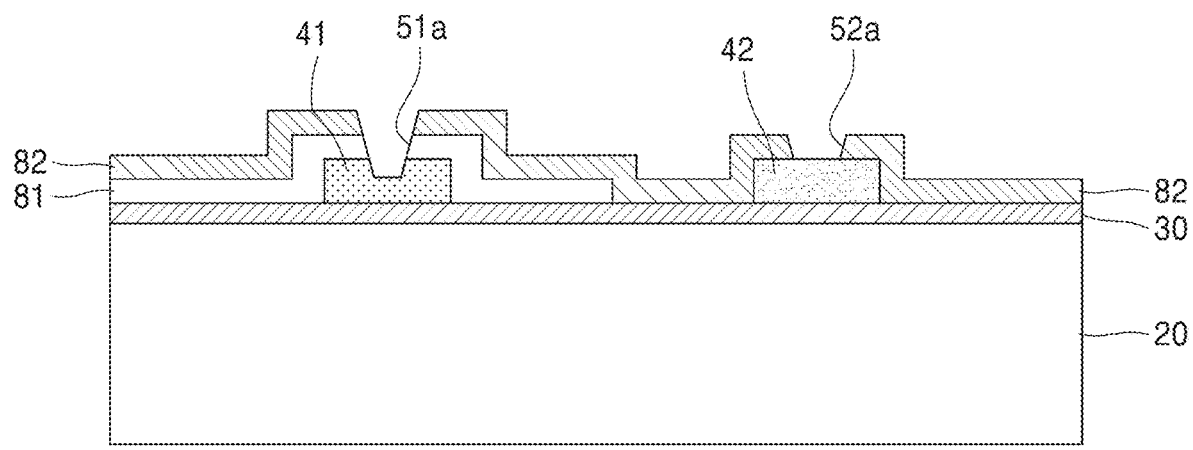
FIGS. 8E and 8F are diagrams illustrating an embodiment of a method of manufacturing a semiconductor integrated circuit device.
Figure 8F:
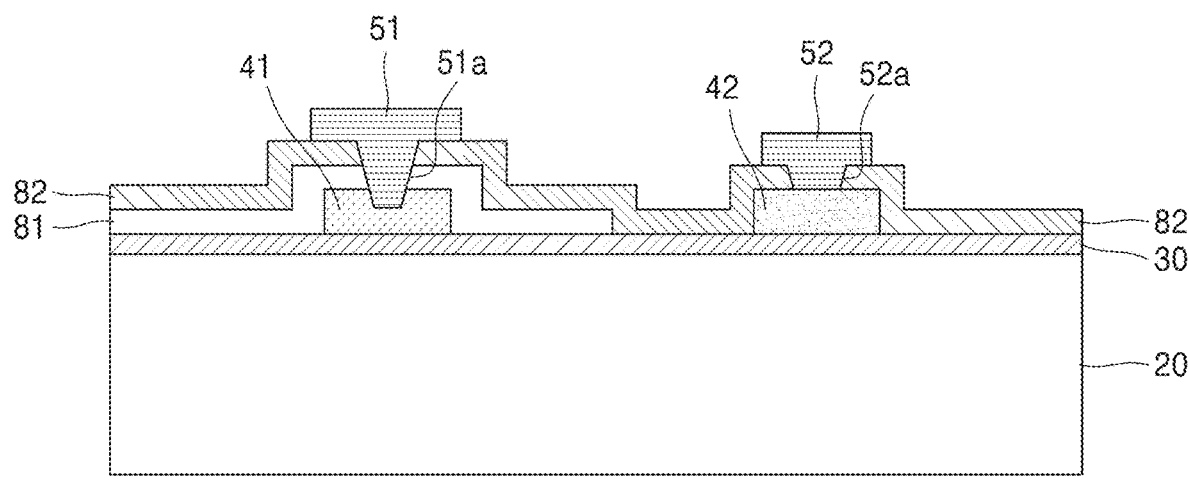
Figure 9:
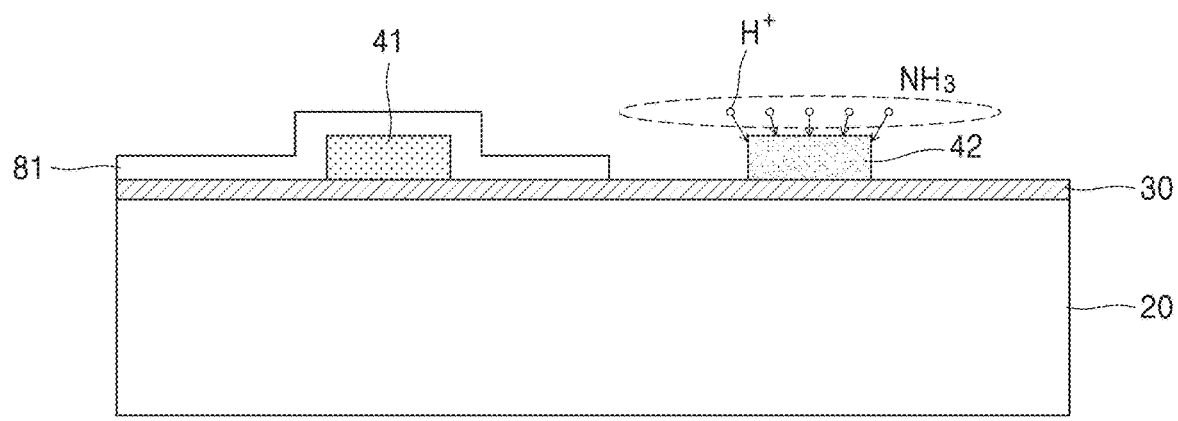
FIG. 9 is a diagram illustrating an embodiment of an operation of inactivating a second p-type semiconductor layer.

In an embodiment, as illustrated in FIGS. 8E and 8F, a semiconductor integrated circuit device may be formed where the first gate 51 is partially inserted into the first p-type semiconductor layer 41 via the via 51a and the second gate 52 contacts the upper surface of the second p-type semiconductor layer 42 via the via 52a. The embodiment in FIGS. 8E and 8F differs from the embodiment in FIGS. 8A and 8B because the via 51a formed in FIG. 8E passes through the second passivation layer 82 and the first passivation layer 81 to penetrate partially into the first p-type semiconductor layer 41. Additionally, in FIG. 8E the via 52a penetrates through the second passivation layer 82 to contact the upper surface of the second p-type semiconductor layer 42, but does not penetrate into the second p-type semiconductor layer 42. Although not illustrated, an insulating layer 83 may be formed over the second passivation layer 82, first gate 51, and second gate 52 in FIG. 8E. Then, first and second sources 61 and 62 and first and second drains 71 and 72 that connect the channel layer 20 may be formed like those shown in FIG. 3. The method of manufacturing a semiconductor integrated circuit device, according to the embodiment, may include partially inactivating a dopant of the second p-type semiconductor layer 42 before forming the second passivation layer 82. FIG. 9 is a diagram illustrating an embodiment of an operation of inactivating the second p-type semiconductor layer 42. Referring to FIG. 9, after performing the operations of FIGS. 7A through 7C described above, the first p-type semiconductor layer 41 is covered by the first passivation layer 81 and protected, and the second p-type semiconductor layer 42 is exposed. In this state, the second p-type semiconductor layer 42 may be partially inactivated. The partial inactivation may include supplying hydrogen ions to the second p-type semiconductor layer 42. For example, in a high voltage state, a source gas, for example, $NH_3$ gas, may be supplied into a reaction chamber. Then the $NH_3$ gas may be dissolved to generate hydrogen ions, and the hydrogen ions are implanted into the exposed second p-type semiconductor layer 42. The hydrogen ions react with a dopant in the second p-type semiconductor layer 42, for example, Mg, to form $MgH_2$, thereby inactivating Mg. Accordingly, an active dopant concentration in the second p-type semiconductor layer 42 may be reduced. In this operation, a hydrogen gas may also be used as the process gas instead of $NH_3$ gas. Next, the operations of FIGS. 7D through 7F may be performed. According to this configuration, a control range of an active dopant concentration of the second p-type semiconductor layer 42 may be increased without excessively increasing the process time of forming the second passivation layer 82, that is, without excessively increasing a thickness of the second passivation layer 82.

In the embodiments of the method of manufacturing a semiconductor integrated circuit device, described above, a gate is first formed, and then a source and a drain are formed, but the source and the gate may also be formed first and then the gate may be formed.

Figure 10A:
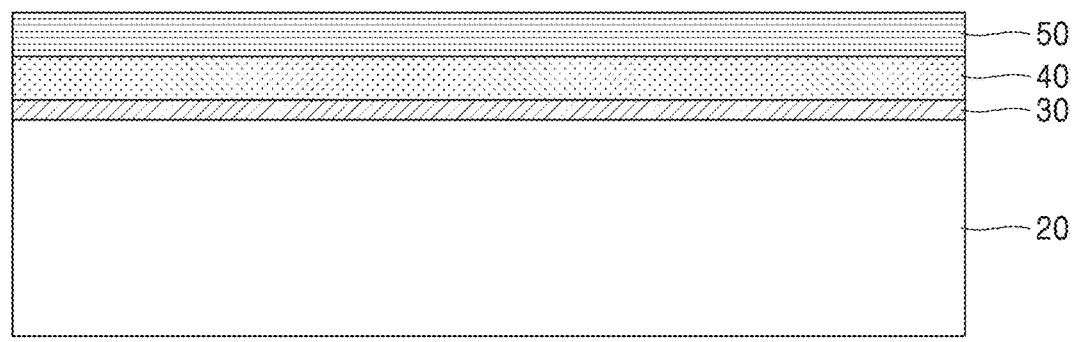
FIGS. 10A through 10E are diagrams illustrating an embodiment of a method of manufacturing a semiconductor integrated circuit device.
Figure 10B:
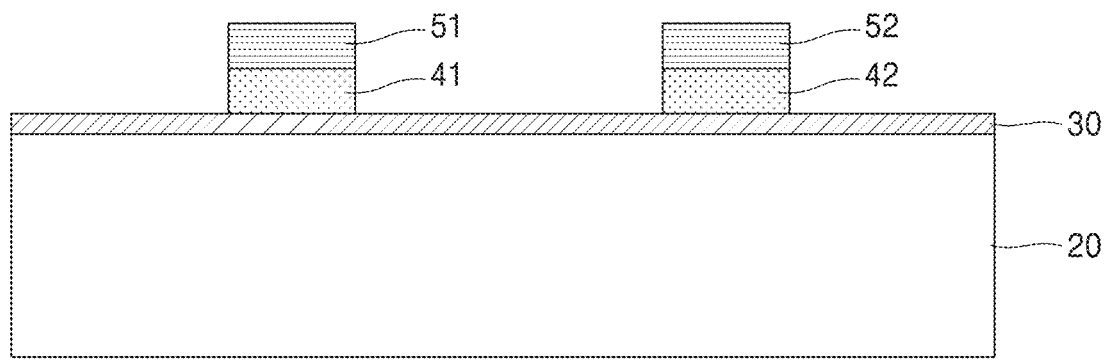

A gate may also be formed on a p-type semiconductor layer before forming a passivation layer on the p-type semiconductor layer. In this case, the operations of FIGS. 7A through 7E may be replaced with operations illustrated in FIGS. 10A through 10E. FIGS. 10A through 10E are diagrams illustrating an embodiment of a method of manufacturing a semiconductor integrated circuit device. First, as illustrated in FIG. 10A, a channel layer 20, a barrier layer 30 inducing 2DEG in the channel layer 20, and a p-type semiconductor layer 40 are sequentially formed on a substrate (not shown). Next, a gate layer 50 is formed on the p-type semiconductor layer 40. The gate layer 50 may include a conductive material layer. Next, as illustrated in FIG. 10B, the p-type semiconductor layer 40 and the gate layer 50 are etched to partition the same into a first stack including the first p-type semiconductor layer 41 and the first gate 51 and a second stack including the second p-type semiconductor layer 42 and the second gate 52 that are spaced apart from each other.

Figure 10C:
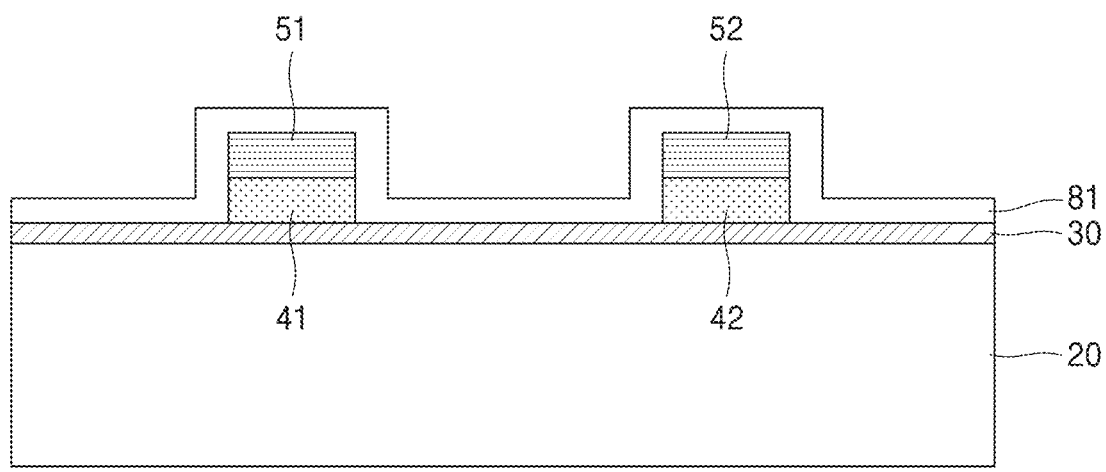
Figure 10D:
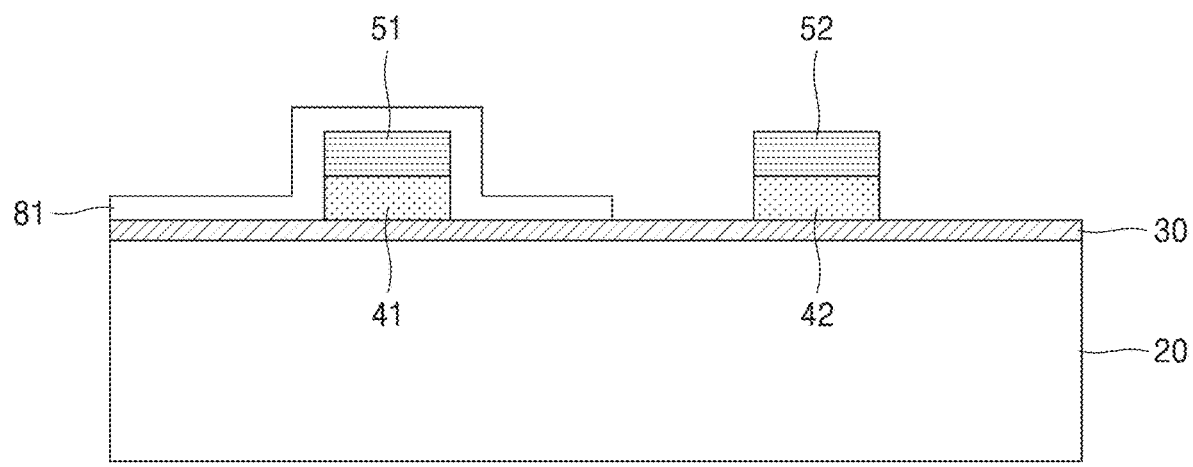
Figure 10E:
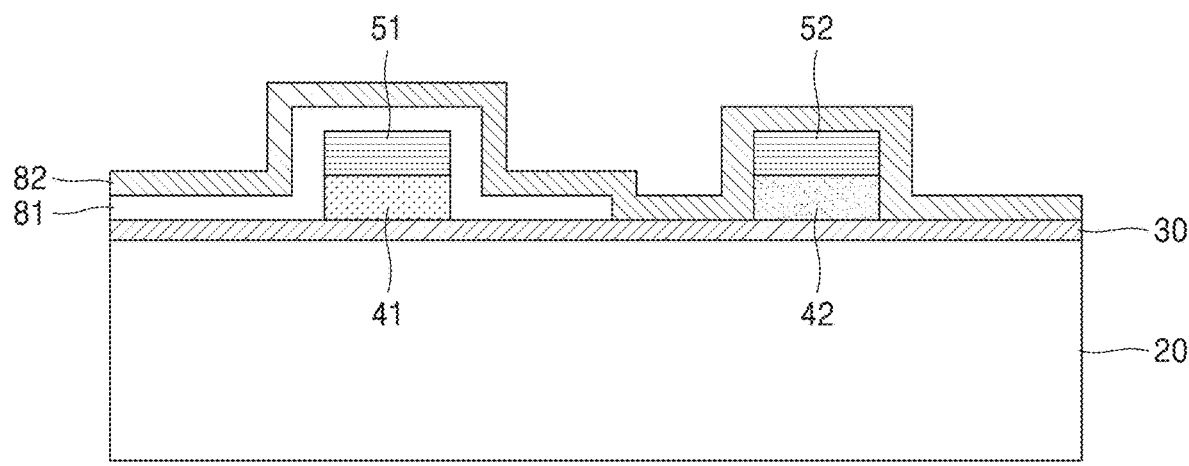

Next, as illustrated in FIG. 10C, the first passivation layer 81 is formed on the first stack including the first p-type semiconductor layer 41 and the first gate 51 and the second stack including the second p-type semiconductor layer 42 and the second gate 52. Next, as illustrated in FIG. 10D, the first passivation layer 81 is partially etched to expose the second stack including the second p-type semiconductor layer 42 and the second gate 52. Next, as illustrated in FIG. 10E, a second passivation layer 82 is formed on the second stack including the second p-type semiconductor layer 42 and the second gate 52. The second passivation layer 82 may be formed also on the first passivation layer 81. A material composition of the first and second passivation layers 81 and 82 may be a combination of a nitride layer-nitride layer or a combination of an oxide layer-nitride layer, as described above. For example, when a material composition of the first and second passivation layers 81 and 82 is a nitride layer-nitride layer, in a process of forming the first passivation layer 81, dopants of the first p-type semiconductor layer 41 and the second p-type semiconductor layer 42 are partially inactivated, and in a process of forming the second passivation layer 82, the dopant of the second p-type semiconductor layer 42 is additionally partially inactivated. For example, when a material composition of the first and second passivation layers 81 and 82 is an oxide layer-nitride layer, in a process of forming the second passivation layer 82, the dopant of the second p-type semiconductor layer 42 is partially inactivated. Also, after performing the operation illustrated in FIG. 10D and before performing the operation illustrated in FIG. 10E, the operation illustrated in FIG. 9 may be performed to partially inactivate the dopant of the second p-type semiconductor layer 42. Next, the operation of forming the first and second sources 61 and 62 and the first and second drains 71 and 72, illustrated in FIG. 7F, may be performed.

An embodiment of the method of manufacturing a semiconductor integrated circuit device may include: sequentially forming a channel layer, a barrier layer inducing 2DEG in the channel layer, and a p-type semiconductor layer; forming a first protective layer on the p-type semiconductor layer; partitioning the p-type semiconductor layer into a first region covered by the first protective layer and a second region not covered by the first protective layer, by etching the first protective layer; and inactivating a portion of a dopant of the second region of the p-type semiconductor layer.

The inactivating may include inactivating the portion of the dopant of the second region by forming an inactivation layer including a nitride layer, on the first protective layer and in the second region. The nitride may include at least one of SiN and $SiN_xO_y$. The first protective layer may include at least one of $SiO_2$, $HfO_x$, and $Al_2O_3$. The method may include removing the first protective layer and the inactivation layer; and partitioning the p-type semiconductor layer of the first region and the second region into a first p-type semiconductor layer and a second p-type semiconductor layer, spaced apart from each other. In the removing of the first protective layer and the inactivation layer, thicknesses of the p-type semiconductor layer of the first region and the second region may be made different from each other.

The inactivating may include supplying hydrogen ions to the second p-type semiconductor layer of the second region. The method may include removing the first protective layer and the inactivation layer; and partitioning the p-type semiconductor layer of the first region and the second region into a first p-type semiconductor layer and a second p-type semiconductor layer, spaced apart from each other. In the removing of the first protective layer and the inactivation layer, thicknesses the p-type semiconductor layer of the first region and the second region may be made different from each other.

FIGS. 11A through 11F are diagrams illustrating an embodiment of a method of manufacturing a semiconductor integrated circuit device. The embodiment of the method of manufacturing the semiconductor integrated circuit device disclosed in FIGS. 11A through 11F relates to a method of partitioning a p-type semiconductor layer into a region protected by a protective layer and a region not protected, and then partially inactivating a dopant of the non-protected region. A growth substrate is omitted in FIGS. 11A through 11F.

Figure 11A:
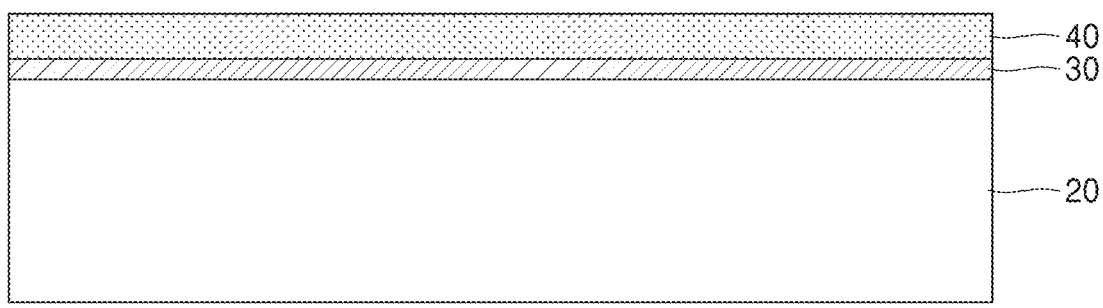
FIGS. 11A through 11F are diagrams illustrating an embodiment of a method of manufacturing a semiconductor integrated circuit device.

First, referring to FIG. 11A, the channel layer 20, the barrier layer 30 inducing 2DEG in the channel layer 20, and the p-type semiconductor layer 40 are sequentially formed on a substrate (not shown). The channel layer 20, the barrier layer 30, and the p-type semiconductor layer 40 may have a single-layer or multi-layer structure including at least one material selected from nitrides including Group III-V materials, for example, at least one of Al, Ga, and In. For example, the channel layer 20, the barrier layer 30, and the p-type semiconductor layer 40 may include $Al_xIn_yGa_{1-x-y}N$ (0≤x≤1, 0≤y≤1, x+y≤1). For example, the channel layer 20, the barrier layer 30, and the p-type semiconductor layer 40 may include at least one of AlN, GaN, InN, and InGaN or AlGaN, AlInN, and AlInGaN. The channel layer 20, the barrier layer 30, and the p-type semiconductor layer 40 may include a same material as each other, and may be distinguished from one another by relative positions and/or different material compositions thereof. For example, the channel layer 20 may include GaN, and may be an undoped layer, or a layer doped with an impurity. The channel layer 20 may have a thickness of about several hundreds of nm or less. For example, the barrier layer 30 may include AlGaN. For example, the p-type semiconductor layer 40 include GaN. The p-type semiconductor layer 40 may be doped with a p-type impurity such as Mg. The p-type semiconductor layer 40 is formed with a uniform thickness on the barrier layer 30, and a dopant concentration thereof is also uniform.

The substrate may include, for example, sapphire, Si, SiC, or GaN, but is not limited thereto, and may include other various materials. For example, although not illustrated in the drawings, a seed layer and a buffer layer may be sequentially provided on the substrate, and the channel layer 20 may be formed on the buffer layer. The seed layer may be a base layer for growth of the buffer layer. The buffer layer mitigates a difference in lattice constants and coefficients of thermal expansion between the substrate and the channel layer 20 to thereby limit and/or prevent degradation in the crystallinity of the channel layer 20. The buffer layer may include at least one material selected from nitrides including Group III-V materials, for example, at least one of Al, Ga, and In.

Figure 11B:
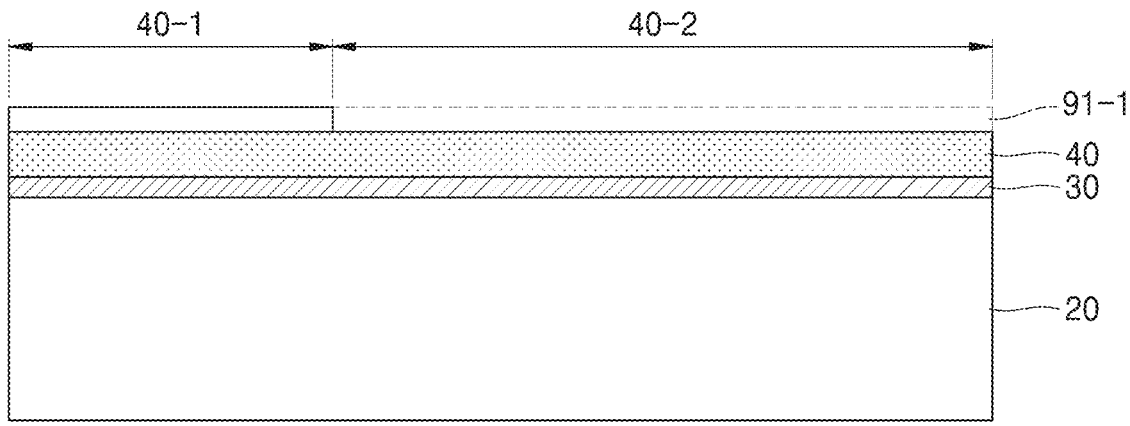

Next, as illustrated in FIG. 11B, a first protective layer 91-1 is formed on the p-type semiconductor layer 40. The first protective layer 91-1 may include an oxide, for example, at least one of $SiO_2$, $HfO_x$, and $Al_2O_3$. Next, the first protective layer 91-1 may be etched to remove a portion of the first protective layer 91-1 (portion denoted by a dashed line). Accordingly, the p-type semiconductor layer 40 may be partitioned into a first region 40-1 covered by the first protective layer 91-1 and a second region 40-2 not covered by the first protective layer 91-1. The first protective layer 91-1 covers the first region 40-1 of the p-type semiconductor layer 40 to limit and/or prevent inactivation of the first region 40-1 of the p-type semiconductor layer 40. An upper surface of the p-type semiconductor layer 40 is exposed in the second region 40-2.

Figure 11C:
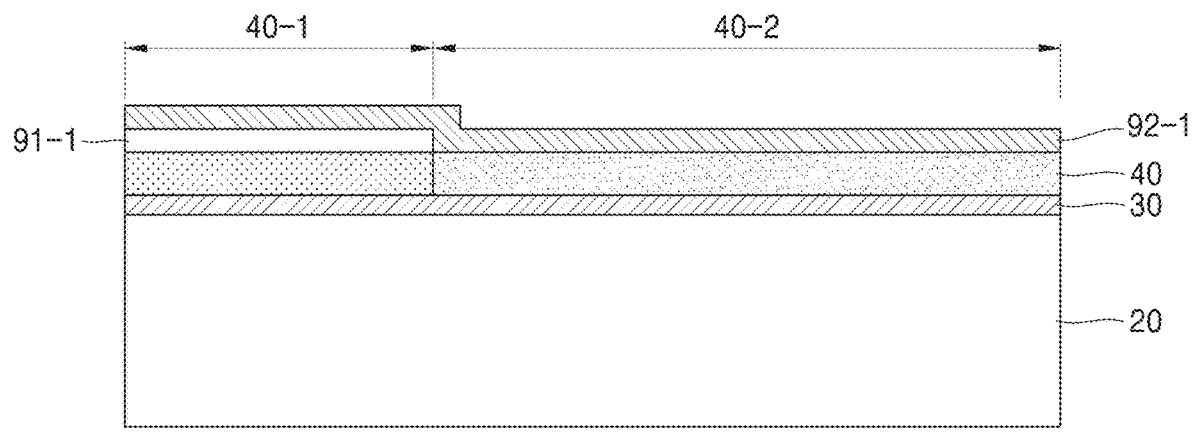

Next, an operation of partially inactivating a dopant of the second region 40-2 by inactivating the second region 40-2 of the p-type semiconductor layer 40 is performed. In an embodiment, the inactivating may be performed by an operation of forming an inactivation layer including a nitride. Referring to FIG. 11C, a first inactivation layer 92-1 including a nitride is formed on the first protective layer 91-1 and in the second region 40-2 of the p-type semiconductor layer 40. The first inactivation layer 92-1 provides inactivation ions to the second region 40-2 of the p-type semiconductor layer 40. The inactivation ions may include, for example, hydrogen ions. The first inactivation layer 92-1 may include a nitride that may provide hydrogen ions, for example, at least one of SiN and $SiN_xO_y$. For example, by providing $NH_3$ and $SiH_4$ as a process gas, a SiN-first inactivation layer 92-1 may be formed. Hydrogen ions are generated in this process, and the hydrogen ions are implanted into the second region 40-2 of the p-type semiconductor layer 40, the upper surface of which is exposed. The hydrogen ions react with a dopant in the p-type semiconductor layer 40 of the second region 40-2, for example, Mg, to form $MgH_2$, thereby inactivating Mg. Accordingly, an active dopant concentration in the p-type semiconductor layer 40 in the second region 40-2 may be reduced. In the first region 40-1, the p-type semiconductor layer 40 is protected by, for example, the $SiO_2$-first protective layer 91-1, and thus, hydrogen ions are not implanted into the p-type semiconductor layer 40. Accordingly, the active dopant concentration in the p-type semiconductor layer 40 is not varied in the first region 40-1. According to this configuration, the active dopant concentration of the p-type semiconductor layer 40 becomes different between the first region 40-1 and the second region 40-2.

Figure 11D:
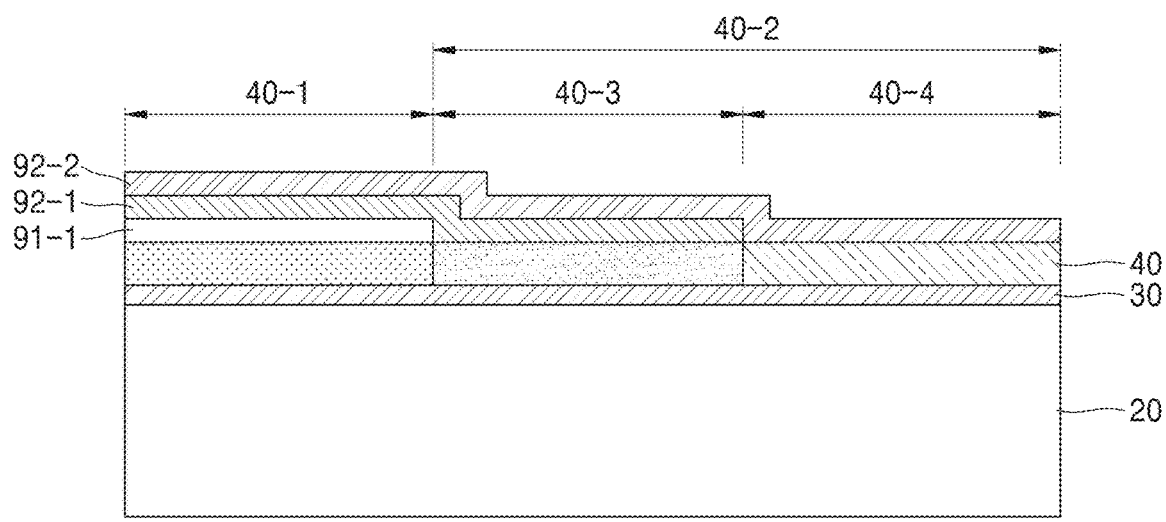
Figure 11E:
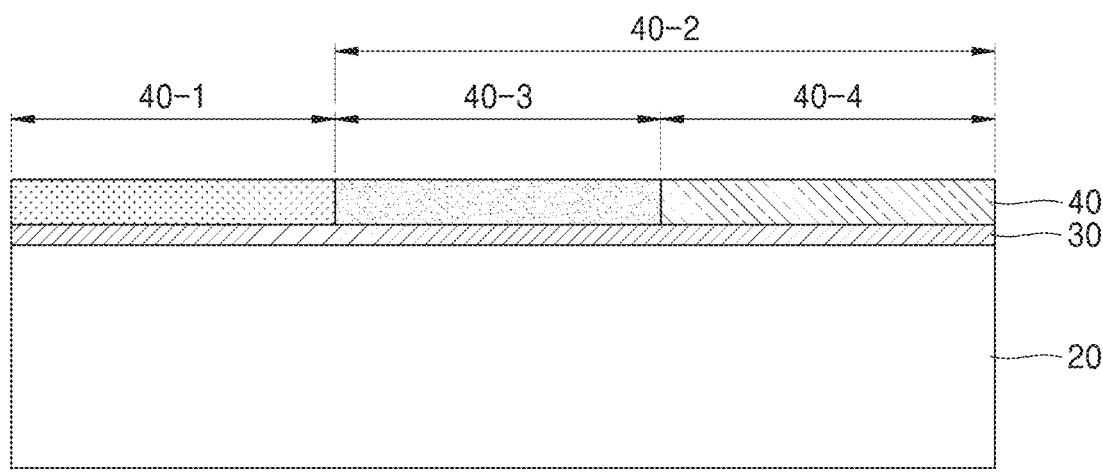
Figure 11F:
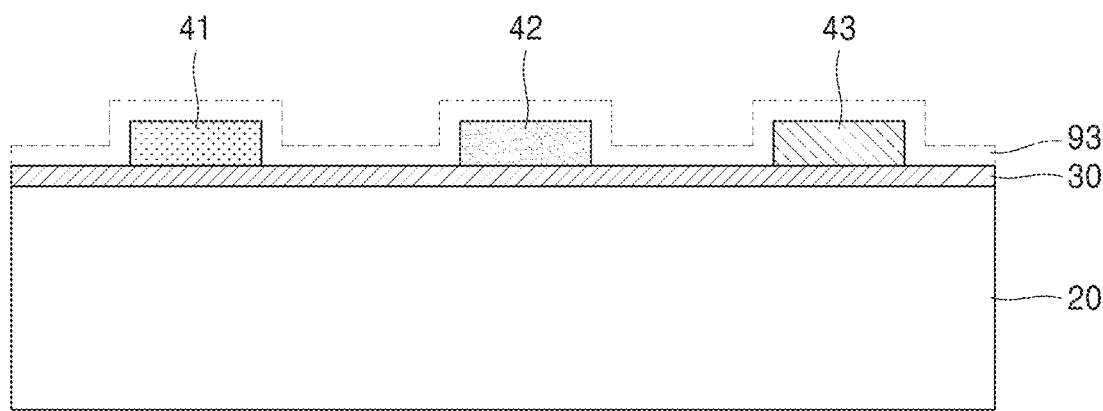

Next, as illustrated in FIG. 11E, the first protective layer 91-1 and the first inactivation layer 92-1 are removed. For example, the first protective layer 91-1 and the first inactivation layer 92-1 may be removed using a wet etching process. In this case, a thickness of the p-type semiconductor layer 40 may be uniform overall. The p-type semiconductor layer 40 having the first region 40-1 and the second region 40-2 with different active dopant concentrations from each other is formed on the barrier layer 30. Next, the p-type semiconductor layer 40 of the first region 40-1 and the second region 40-2 is partitioned into the first and second p-type semiconductor layers 41 and 42 that are spaced apart from each other, as illustrated in FIG. 11F. The partitioning process may be performed through an etching process using an etching mask. Accordingly, the first and second p-type semiconductor layers 41 and 42 having different active dopant concentrations from each other may be formed.

According to an embodiment, the first inactivation layer 92-1 may be etched to partition the second region 40-2 of the p-type semiconductor layer 40 into a third region 40-3 covered by the first inactivation layer 92-1 and a fourth region 40-4 not covered by the first inactivation layer 92-1, as illustrated in FIG. 11D. Next, an operation of partially inactivating a portion of a dopant of the fourth region 40-4 by inactivating the fourth region 40-4 of the p-type semiconductor layer 40 may be further performed. A second inactivation layer 92-2 including a nitride may be formed on the first inactivation layer 92-1 and in the fourth region 40-4 of the p-type semiconductor layer 40. The second inactivation layer 92-2 provides inactivation ions to the fourth region 40-4 of the p-type semiconductor layer 40. The inactivation ions may include, for example, hydrogen ions. The second inactivation layer 92-2 may include a nitride that may provide hydrogen ions, for example, at least one of SiN and $SiN_xO_y$. For example, by providing $NH_3$ and $SiH_4$ as a process gas, the SiN second inactivation layer 92-2 may be formed. Hydrogen ions are generated in this process, and the hydrogen ions are implanted into the fourth region 40-4 of the p-type semiconductor layer 40, the upper surface of which is exposed. The hydrogen ions react with a dopant in the p-type semiconductor layer 40 of the fourth region 40-4, for example, Mg, to form $MgH_2$, thereby inactivating Mg. Accordingly, an active dopant concentration in the p-type semiconductor layer 40 may be reduced in the fourth region 40-4. In the first region 40-1 and the third region 40-3, the p-type semiconductor layer 40 is protected by the $SiO_2$-first protective layer 91-1 and the first inactivation layer 92-1, and thus, hydrogen ions are not implanted into the p-type semiconductor layer 40. Accordingly, the active dopant concentration in the p-type semiconductor layer 40 in the first region 40-1 and the third region 40-3 may not be varied or a variation thereof may be very small. According to this configuration, the active dopant concentrations of the p-type semiconductor layer 40 becomes different among the first region 40-1, the third region 40-3, and the fourth region 40-4.

Next, as illustrated in FIG. 11E, the first protective layer 91-1 and the first and second inactivation layers 92-1 and 92-2 are removed through, for example, a wet etching process. Then, the p-type semiconductor layer 40 having a uniform thickness and having different active dopant concentrations in the first region 40-1, the third region 40-3, and the fourth region 40-4 from each other is formed on the barrier layer 30. Next, the p-type semiconductor layer 40 of the first region 40-1, the third region 40-3, and the fourth region 40-4 is partitioned into first, second, and third p-type semiconductor layers 41, 42, and 43 that are spaced apart from each other, as illustrated in FIG. 11F. The partitioning process may be performed through an etching process using an etching mask. Accordingly, the first, second, and third p-type semiconductor layers 41, 42, and 43 having different active dopant concentrations from each other may be formed. By performing a subsequent process of forming a gate, source, and drain, a semiconductor integrated circuit device including three HEMTs having different threshold voltages from each other may be manufactured.

Next, by forming an insulating layer 93 on the first, second, and third p-type semiconductor layers 41, 42, and 43, and forming the first and second gates 51 and 52, the first and second sources 61 and 62, and the first and second drains 71 and 72 by referring to the operations illustrated in FIGS. 7E and 7F, a semiconductor integrated circuit device including the first and second HEMTs 11 and 12 having different threshold voltages from each other may be manufactured. Also, by referring to the operations illustrated in FIGS. 8A and 8B, the second gate 52 may be partially inserted into the second p-type semiconductor layer 42. Also, as illustrated in FIG. 11F, after partitioning the p-type semiconductor layer 40 into the first and second p-type semiconductor layers 41 and 42 that are spaced apart from each other, the operations of FIGS. 7B through 7D or the operation of FIG. 9 may be performed to further reduce the active dopant concentration of the second p-type semiconductor layer 42.

Figure 12A:
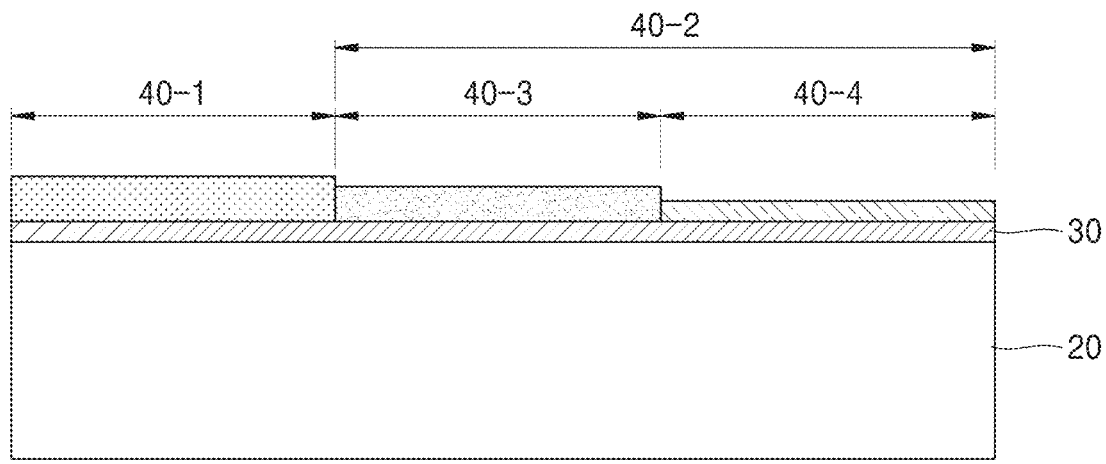
FIGS. 12A and 12B are cross-sectional views illustrating an embodiment of a method of manufacturing a semiconductor integrated circuit device.
Figure 12B:
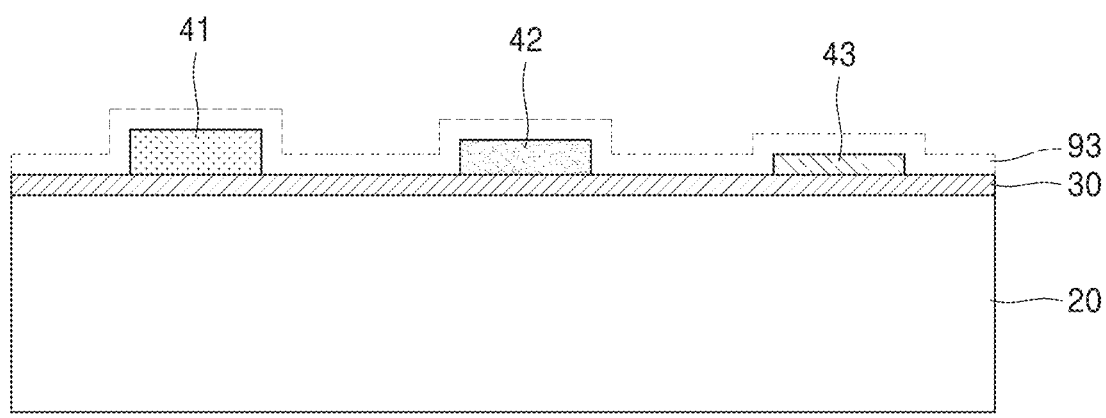

FIGS. 12A and 12B are cross-sectional views illustrating an embodiment of a method of manufacturing a semiconductor integrated circuit device. When performing the operation of partitioning the p-type semiconductor layer 40 into the first, second, and third p-type semiconductor layers 41, 42, and 43, thicknesses of the p-type semiconductor layer 40 in the first region 40-1 and the second region 40-2 may be made different from each other. In this case, the operations of FIGS. 11E and 11F may be replaced with operations illustrated in FIGS. 12A and 12B. After the operation of FIG. 11D is performed, as illustrated in FIG. 12A, an operation of removing the first protective layer 91-1 and the first and second inactivation layers 92-1 and 92-2 is performed. The above operation may be performed by, for example, a dry etching operation. In this case, due to a thickness difference in a stacked layer covering the first, third, and fourth regions 40-1, 40-3, and 40-4, that is, the first protective layer 91-1 and the first and second inactivation layers 92-1 and 92-2, an etching depth of the p-type semiconductor layer 40 is smallest in the first region 40-1, and deeper in the order of the third region 40-3 and the fourth region 40-4. Accordingly, after the first protective layer 91-1 and the first and second inactivation layers 92-1 and 92-2 are removed, the thickness of the p-type semiconductor layer 40 decreases in the order of the first region 40-1, the third region 40-3, and the fourth region 40-4, as illustrated in FIG. 12A. Next, the p-type semiconductor layer 40 of the first, second, and third regions 40-1, 40-2, and 40-3 is partitioned into first, second, and third p-type semiconductor layers 41, 42, and 43 that are spaced apart from each other, as illustrated in FIG. 12B. The partitioning process may be performed through an etching process using an etching mask. Accordingly, the first, second, and third p-type semiconductor layers 41, 42, and 43 having different active dopant concentrations and thicknesses from each other may be formed.

After performing the operation of FIG. 12B, by forming the insulating layer 93 is formed on the first, second, and third p-type semiconductor layers 41, 42, and 43, and forming the first and second gates 51 and 52, the first and second sources 61 and 62, and the first and second drains 71 and 72 by referring to the operations illustrated in FIGS. 7E and 7F, a semiconductor integrated circuit device including the first and second HEMTs 11 and 12 having different threshold voltages from each other may be manufactured. Also, by referring to the operations illustrated in FIGS. 8A and 8B, the second gate 52 may be partially inserted into the second p-type semiconductor layer 42. Also, as illustrated in FIG. 12B, after partitioning the p-type semiconductor layer 40 into the first and second p-type semiconductor layers 41 and 42 that are spaced apart from each other, the operations of FIGS. 7B through 7D or the operation of FIG. 9 may be performed to further reduce the active dopant concentration of the second p-type semiconductor layer 42.

Figure 13A:
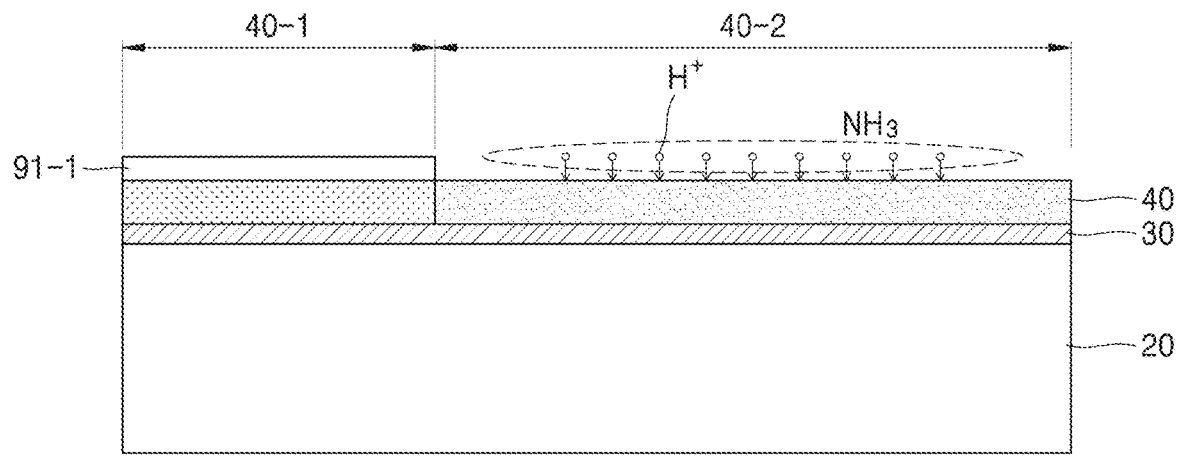
FIGS. 13A and 13B are cross-sectional views illustrating an embodiment of a method of manufacturing a semiconductor integrated circuit device.
Figure 13B:
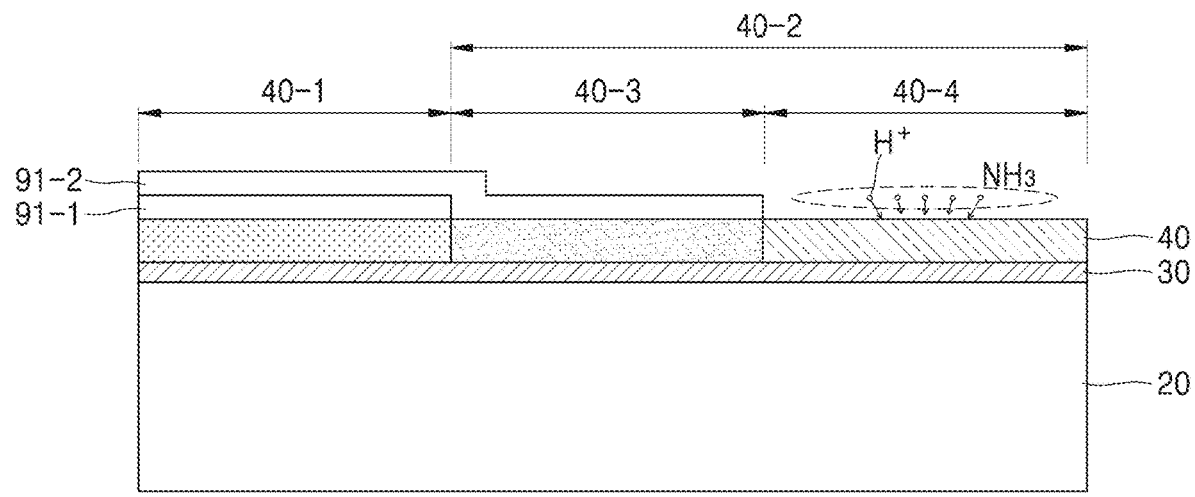

FIGS. 13A and 13B are cross-sectional views illustrating an embodiment of a method of manufacturing a semiconductor integrated circuit device. In an embodiment, an inactivating operation may be performed by supplying hydrogen ions to a p-type semiconductor layer. In this case, instead of the operations of FIGS. 11C and 11D, the operations of FIGS. 13A and 13B are performed. First, referring to FIG. 13A, the first region 40-1 of the p-type semiconductor layer 40 is covered by the first protective layer 91-1 to be protected, and the second region 40-2 of the p-type semiconductor layer 40 is exposed. In this state, hydrogen ions may be supplied to the second region 40-2 of the p-type semiconductor layer 40. For example, in a high voltage state, $NH_3$ gas, may be supplied into a reaction chamber. Then the $NH_3$ gas may be dissolved to generate hydrogen ions, and the hydrogen ions are implanted into the exposed second region 40-2 of the second p-type semiconductor layer 42. The hydrogen ions react with a dopant in the second region 40-2 of the second p-type semiconductor layer 42, for example, Mg, to form $MgH_2$, thereby inactivating Mg. Accordingly, an active dopant concentration of the second region 40-2 of the second p-type semiconductor layer 42 may be reduced. As a process gas, hydrogen ($H_2$) gas may be used instead of $NH_3$ gas. Accordingly, the p-type semiconductor layer 40 having the first region 40-1 and the second region 40-2 that have different active dopant concentrations from each other may be implemented.

According to an embodiment, the second region 40-2 of the p-type semiconductor layer 40 may be partitioned into the third region 40-3 covered by the second protective layer 91-2 and the fourth region 40-4 not covered by the second protective layer 91-2, as illustrated in FIG. 13B. Next, an operation of partially inactivating a portion of a dopant of the fourth region 40-4 by hydrogenating the fourth region 40-4 of the p-type semiconductor layer 40 may be further performed. In the first region 40-1 and the third region 40-3, the p-type semiconductor layer 40 is protected by the first protective layer 91-1 and the second protective layer 91-2, and thus, hydrogen ions are not implanted into the p-type semiconductor layer 40. Accordingly, the active dopant concentration in the p-type semiconductor layer 40 in the first region 40-1 and the third region 40-3 is not varied. According to this configuration, the p-type semiconductor layer 40 including the first region 40-1, the third region 40-3, and the fourth region 40-4 having different active dopant concentrations from each other may be formed.

The semiconductor integrated circuit device according to the embodiment may be used in components that may require transistors of various types of threshold voltages, such as a radio frequency integrated circuit (RFIC) and an RF element using radio frequency, for example, in mobile communication, satellite communication, or the like, a power management integrated circuit (PMIC), and a power semiconductor device. As another example, the semiconductor integrated circuit device according to an embodiment may be used as a power semiconductor component of a quick charger for mobile devices, a switching converter used in a power supply for servers, a charger for automobiles, a sensor for automobiles such as a light detection and ranging (LiDAR), or robots.

Figure 14:
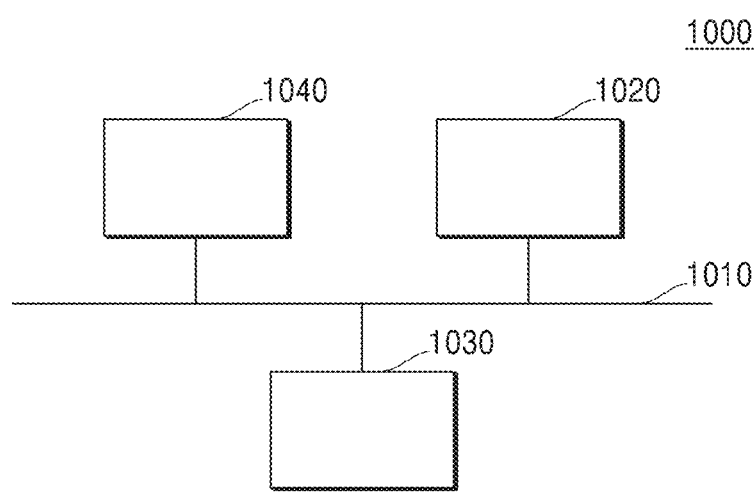
FIG. 14 is a schematic of an electronic device according to an embodiment.

FIG. 14 is a schematic of an electronic device according to an embodiment.

Referring to FIG. 14, the electronic device 1000 includes one or more electronic device components, including processing circuitry 1020 and a memory 1030 that are communicatively coupled together via a bus 1010.

The processing circuitry 1020, may be included in, may include, and/or may be implemented by one or more instances of processing circuitry such as hardware including logic circuits, a hardware/software combination such as a processor executing software; or a combination thereof. For example, the processing circuitry 1020 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1030 may include a non-transitory computer readable storage device, for example a solid state drive (SSD), storing a program of instructions, and the processing circuitry 1020 may be configured to execute the program of instructions to implement the functionality of the electronic device 1000.

In some example embodiments, the electronic device 1000 may include one or more additional components 1040, coupled to bus 1010, which may include, for example, a power supply, a light sensor, a light-emitting device, any combination thereof, or the like. In some example embodiments, one or more of the processing circuitry 1020, memory 1030, or one or more additional components 1040 may include any power semiconductor device according to any of the semiconductor integrated circuit device described herein.

According to the above-described embodiments, a semiconductor integrated circuit device having a plurality of devices having two or more threshold voltages may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A semiconductor integrated circuit device comprising:
  a channel layer;
  a barrier layer on the channel layer and configured to induce a 2-dimensional electron gas (2DEG) in the channel layer;
  a first p-type semiconductor layer and a second p-type semiconductor layer spaced apart from each other on the barrier layer; and
  a passivation layer on the first p-type semiconductor layer and the second p-type semiconductor layer,
  wherein the passivation layer is configured to partially inactivate at least one of a dopant of the first p-type semiconductor layer or a dopant of the second p-type semiconductor layer.

2. The semiconductor integrated circuit device of claim 1, wherein the passivation layer comprises a first portion on the first p-type semiconductor layer and a second portion on the second p-type semiconductor layer, and
a thickness or a material composition of the first portion is different from a thickness or a material composition of the second portion, or
both the thickness and the material composition of the first portion are different than the thickness and the material composition of the second portion.

3. The semiconductor integrated circuit device of claim 1, wherein the passivation layer comprises a first passivation layer on the first p-type semiconductor layer and a second passivation layer on the second p-type semiconductor layer and the first passivation layer, and
at least one of the first passivation layer or the second passivation layer is configured to partially inactivate the dopant of at least one of the first p-type semiconductor layer or the second p-type semiconductor layer.

4. The semiconductor integrated circuit device of claim 3, wherein the first passivation layer and the second passivation layer partially inactivate the dopant of the first p-type semiconductor layer and the dopant of the second p-type semiconductor layer.

5. The semiconductor integrated circuit device of claim 3, wherein
the second passivation layer is configured to partially inactivate the dopant of the second p-type semiconductor layer, and
the first passivation layer is configured to prevent inactivation of the dopant of the first p-type semiconductor layer.

6. The semiconductor integrated circuit device of claim 1, wherein a thickness of the first p-type semiconductor layer is equal to a thickness of the second p-type semiconductor layer.

7. The semiconductor integrated circuit device of claim 1, wherein a thickness of the first p-type semiconductor layer differs from a thickness of the second p-type semiconductor layer.

8. The semiconductor integrated circuit device of claim 1, further comprising:
a first gate contacting the first p-type semiconductor layer; and
a second gate contacting the second p-type semiconductor layer, wherein
the first gate is partially in the first p-type semiconductor layer or the second gate is partially inserted into the second p-type semiconductor layer, or
both the first gate is partially in the first p-type semiconductor layer and the second gate is partially inserted into the second p-type semiconductor layer.

9. A semiconductor integrated circuit device comprising:
a channel layer;
a barrier layer on the channel layer and configured to induce a 2-dimensional electron gas (2DEG) in the channel layer; and
a first p-type semiconductor layer and a second p-type semiconductor layer on an upper surface of the barrier layer and spaced apart from each other in a direction parallel to the upper surface the barrier layer,
wherein an active dopant concentration in the first p-type semiconductor layer differs from an active dopant concentration in the second p-type semiconductor layer.

10. The semiconductor integrated circuit device of claim 9, wherein a thickness of the first p-type semiconductor layer is equal to a thickness of the second p-type semiconductor layer.

11. The semiconductor integrated circuit device of claim 9, wherein a thickness of the first p-type semiconductor layer differs from a thickness of the second p-type semiconductor layer.

12. The semiconductor integrated circuit device of claim 9, further comprising:
a passivation layer on the first p-type semiconductor layer and the second p-type semiconductor layer,
wherein the passivation layer is configured to partially inactivate at least one of a dopant of the first p-type semiconductor layer or a dopant of the second p-type semiconductor layer.

13. The semiconductor integrated circuit device of claim 9, further comprising:
a first gate contacting the first p-type semiconductor layer; and
a second gate contacting the second p-type semiconductor layer, wherein
the first gate is partially in the first p-type semiconductor layer or the second gate is partially in the second p-type semiconductor layer, or
both the first gate is partially in the first p-type semiconductor layer and the second gate is partially in the second p-type semiconductor layer.

* * * * *